US012631688B2

(12) United States Patent
Yoshitake et al.

(10) Patent No.:  US 12,631,688 B2
(45) Date of Patent:      May 19, 2026

(54) DIAGNOSTIC DEVICE, DIAGNOSTIC METHOD, AND NON-TRANSITORY COMPUTER-READABLE RECORDING MEDIUM

(71) Applicant: YOKOGAWA ELECTRIC CORPORATION, Tokyo (JP)

(72) Inventors: Satoshi Yoshitake, Tokyo (JP); Masahiro Kazumi, Tokyo (JP); Hiroshi Akahori, Tokyo (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 551 days.

(21) Appl. No.: 17/951,455

(22) Filed: Sep. 23, 2022

(65) Prior Publication Data

US 2023/0098799 A1      Mar. 30, 2023

(30) Foreign Application Priority Data

Sep. 30, 2021      (JP) ................................. 2021-161866

(51) Int. Cl.
*G01R 31/392*      (2019.01)
*G01R 31/382*      (2019.01)

(52) U.S. Cl.
CPC ......... *G01R 31/392* (2019.01); *G01R 31/382* (2019.01)

(58) Field of Classification Search
CPC .. B60L 3/12; B60L 58/12; B60L 58/16; B60L 58/18; B60Y 2200/91;

(Continued)

(56) References Cited

U.S. PATENT DOCUMENTS

2010/0106351 A1*   4/2010   Hanssen ................... H02J 7/14
                                                    29/401.1
2011/0156649 A1*   6/2011   Wu ...................... H02J 7/00308
                                                    320/118
(Continued)

FOREIGN PATENT DOCUMENTS

CN           105745552 A      7/2016
CN           112319308 A  *  2/2021   ............ B60L 3/0046
(Continued)

OTHER PUBLICATIONS

Torai, Sochiro & Nakagomi, Masaru & Yoshitake, Satoshi & Yamaguchi, Shuichiro & Oyama, Noboru. (2016). State-of-health estimation of LiFePO4/graphite batteries based on a model using differential capacity. Journal of Power Sources. 306. 62-69. 10.1016/j.jpowsour.2015.11.070. (Year: 2015).*
(Continued)

*Primary Examiner* — Catherine T. Rastovski
*Assistant Examiner* — Eric Sebastian Von Wald
(74) *Attorney, Agent, or Firm* — Osha Bergman Watanabe & Burton LLP

(57)      ABSTRACT

A diagnostic device includes: a receiver that receives data of only some of battery cells constituting a storage battery system; and a controller that diagnoses the storage battery system based on the received data. The data has a voltage value and an integrated current amount value. The some of the battery cells include: a low-state MIN battery cell; a low-state MAX battery cell; a high-state MIN battery cell; and a high-state MAX battery cell. The controller executes at least one of: determining whether the battery cells are in a balanced state or an imbalance state; calculating an imbalance amount between capacities of the battery cells; or calculating a value related to a capacity of a battery cell.

6 Claims, 14 Drawing Sheets

(58) Field of Classification Search
CPC .. B60Y 2200/92; G01R 31/392; G01R 31/36; G01R 31/382; G01R 31/396; G01R 31/367; G01R 31/3842; G01R 31/387; G01R 31/006; G01R 31/388; G01R 31/379; H01M 10/482; H01M 2010/4271; H01M 10/42; H01M 2010/4278; H01M 2220/20; H01M 10/441; H01M 10/48; H01M 10/4285; H02J 7/0048; H02J 7/0014; H02J 7/00; H02J 7/007; H02J 7/0047; H02J 7/00714; H02J 7/007182; H02J 7/0013; H02J 7/0016; H02J 7/005; H02J 9/062; Y02E 60/10; Y02E 10/76; Y02T 10/70
See application file for complete search history.

(56) References Cited

U.S. PATENT DOCUMENTS

| | | | | |
|---|---|---|---|---|
| 2013/0207618 | A1* | 8/2013 | Renken | H02J 7/007182 320/155 |
| 2014/0239965 | A1* | 8/2014 | Calderon | G01R 31/396 324/433 |
| 2015/0357859 | A1* | 12/2015 | Pourdarvish | H02J 7/00712 320/159 |
| 2016/0025814 | A1 | 1/2016 | Ide et al. | |
| 2021/0090034 | A1* | 3/2021 | Murai | H01M 10/54 |
| 2021/0098998 | A1* | 4/2021 | Eo | G01R 31/3835 |
| 2021/0399352 | A1* | 12/2021 | Kamel Ahmed | H01M 10/441 |
| 2022/0043069 | A1* | 2/2022 | Yoon | G01R 31/392 |
| 2022/0146585 | A1* | 5/2022 | Hong | G01R 31/392 |
| 2022/0381846 | A1* | 12/2022 | Miftahullatif | H01M 10/482 |
| 2023/0163374 | A1* | 5/2023 | Hara | H02J 7/00 320/118 |
| 2023/0236251 | A1* | 7/2023 | Nishikawa | G06Q 50/40 702/63 |
| 2023/0311706 | A1* | 10/2023 | Takao | B60L 53/80 307/10.1 |

FOREIGN PATENT DOCUMENTS

| | | | | |
|---|---|---|---|---|
| JP | 2016-145795 A | | 8/2016 | |
| WO | WO-2019074220 A1 | * | 4/2019 | G01R 31/36 |

OTHER PUBLICATIONS

First Office Action issued in corresponding Chinese Application No. 202211191910.3, dated Jan. 30, 2026 (14 pages).

* cited by examiner

FIG.6

BALANCED STATE

CLASSIFICATION 1

|  | LOW SOC STATE | HIGH SOC STATE |
|---|---|---|
| MAX CELL | - | O |
| MIN CELL | O | - |

CLASSIFICATION 2

|  | LOW SOC STATE | HIGH SOC STATE |
|---|---|---|
| MAX CELL | O | - |
| MIN CELL | - | O |

CLASSIFICATION 3

|  | LOW SOC STATE | HIGH SOC STATE |
|---|---|---|
| MAX CELL | O | - |
| MIN CELL | - | - |

CLASSIFICATION 4

|  | LOW SOC STATE | HIGH SOC STATE |
|---|---|---|
| MAX CELL | - | O |
| MIN CELL | - | - |

CLASSIFICATION 5

|  | LOW SOC STATE | HIGH SOC STATE |
|---|---|---|
| MAX CELL | - | - |
| MIN CELL | O | - |

CLASSIFICATION 6

|  | LOW SOC STATE | HIGH SOC STATE |
|---|---|---|
| MAX CELL | - | - |
| MIN CELL | - | O |

CLASSIFICATION 7

|  | LOW SOC STATE | HIGH SOC STATE |
|---|---|---|
| MAX CELL | - | - |
| MIN CELL | - | - |

FIG.7

IMBALANCE STATE

CLASSIFICATION 11

|  | LOW SOC STATE | HIGH SOC STATE |
|---|---|---|
| MAX CELL | O | O |
| MIN CELL | - | - |

CLASSIFICATION 12

|  | LOW SOC STATE | HIGH SOC STATE |
|---|---|---|
| MAX CELL | - | - |
| MIN CELL | O | O |

CLASSIFICATION 13

|  | LOW SOC STATE | HIGH SOC STATE |
|---|---|---|
| MAX CELL | O | - |
| MIN CELL | - | - |

CLASSIFICATION 14

|  | LOW SOC STATE | HIGH SOC STATE |
|---|---|---|
| MAX CELL | - | O |
| MIN CELL | - | - |

CLASSIFICATION 15

|  | LOW SOC STATE | HIGH SOC STATE |
|---|---|---|
| MAX CELL | - | - |
| MIN CELL | O | - |

CLASSIFICATION 16

|  | LOW SOC STATE | HIGH SOC STATE |
|---|---|---|
| MAX CELL | - | - |
| MIN CELL | - | O |

CLASSIFICATION 17

|  | LOW SOC STATE | HIGH SOC STATE |
|---|---|---|
| MAX CELL | - | - |
| MIN CELL | - | - |

1

DIAGNOSTIC DEVICE, DIAGNOSTIC METHOD, AND NON-TRANSITORY COMPUTER-READABLE RECORDING MEDIUM

CROSS-REFERENCE TO RELATED APPLICATIONS

The present application claims priority from Japanese Patent Application No. 2021-161866 filed in Japan on Sep. 30, 2021, the contents of which are incorporated herein by reference in their entirety.

BACKGROUND

Technical Field

The present invention relates to a diagnostic device, a diagnostic method, and a non-transitory computer-readable recording medium.

Description of the Related Art

Various methods related to diagnosis of a battery cell have been proposed (e.g., see JP 2016-145795 A).

Some storage battery systems including a plurality of battery cells output only data of some battery cells.

SUMMARY

One or more embodiments can diagnose a storage battery system from data of some battery cells.

According to one or more embodiments, a diagnostic device includes: an acquisition unit (a receiver) that acquires (receives) data of only some (i.e., two or more but not all) of a plurality of battery cells constituting a storage battery system; and a diagnostic unit (controller) that diagnoses the storage battery system based on the data of some battery cells acquired by the acquisition unit, wherein the data includes a voltage (a voltage value) and an integrated current amount (an integrated current amount value), some battery cells include: a battery cell acquired in data as a MIN cell, which is a battery cell having a minimum voltage, in a low state of charge (SOC) state (referred to as "low-state MIN battery cell"); a battery cell acquired in data as a MAX cell, which is a battery cell having a maximum voltage, in the low SOC state (referred to as "low-state MAX battery cell"); a battery cell acquired in data as a MIN cell in a high SOC state (referred to as "high-state MIN battery cell"); and a battery cell acquired in data as a MAX cell in the high SOC state (referred to as "high-state MAX battery cell"), the diagnostic unit includes at least one of: a balance determination unit (the controller) that determines which of a balanced state and an imbalance state the plurality of battery cells is in; an imbalance amount calculator (the controller) that calculates an imbalance amount between capacities of battery cells; or a capacity calculator (the controller) that calculates a value related to a capacity of a battery cell.

According to one or more embodiments, a diagnostic method includes: acquiring (receiving) data of only some (i.e., two or more but not all) of a plurality of battery cells constituting a storage battery system; and diagnosing the storage battery system based on the acquired data of some battery cells, wherein the data includes a voltage (a voltage value) and an integrated current amount (an integrated current amount value), some battery cells include: a battery cell acquired in data as a MIN cell, which is a battery cell having a minimum voltage, in a low state of charge (SOC) state (referred to as "low-state MIN battery cell"); a battery cell acquired in data as a MAX cell, which is a battery cell having a maximum voltage, in the low SOC state (referred to as "low-state MAX battery cell"); a battery cell acquired in data as a MIN cell in a high SOC state (referred to as "high-state MIN battery cell"); and a battery cell acquired in data as a MAX cell in the high SOC state (referred to as "high-state MAX battery cell"), the diagnosing includes at least one of: determining which of a balanced state and an imbalance state the plurality of battery cells is in; calculating an imbalance amount between capacities of battery cells; or calculating a value related to a capacity of a battery cell.

According to one or more embodiments, a non-transitory computer-readable recording medium stores therein diagnostic instructions that cause a computer to execute processing of: acquiring (receiving) data of only some (i.e., two or more but not all) of a plurality of battery cells constituting a storage battery system; and diagnosing the storage battery system based on the acquired data of some battery cells, wherein the data includes a voltage (a voltage value) and an integrated current amount (an integrated current amount value), some battery cells include: a battery cell acquired in data as a MIN cell, which is a battery cell having a minimum voltage, in a low state of charge (SOC) state (referred to as "low-state MIN battery cell"); a battery cell acquired in data as a MAX cell, which is a battery cell having a maximum voltage, in the low SOC state (referred to as "low-state MAX battery cell"); a battery cell acquired in data as a MIN cell in a high SOC state (referred to as "high-state MIN battery cell"); and a battery cell acquired in data as a MAX cell in the high SOC state (referred to as "high-state MAX battery cell"), processing of the diagnosing includes at least one of pieces of processing of: determining which of a balanced state and an imbalance state the plurality of battery cells is in; calculating an imbalance amount between capacities of battery cells; or calculating a value related to a capacity of a battery cell.

BRIEF DESCRIPTION OF THE DRAWINGS

FIG. 6 illustrates an example of classification of a battery cell in the balanced state;

FIG. 7 illustrates an example of the classification of a battery cell in the imbalance state;

DETAILED DESCRIPTION

Embodiments will be described below with reference to the drawings. The same elements are denoted by the same reference signs, and redundant description will be appropriately omitted.

INTRODUCTION

The disclosed technique relates to diagnosis of capacity deterioration of a storage battery such as a lithium-ion battery, more specifically, a battery cell and a storage battery system. The battery cell indicates the smallest unit of a storage battery that can be handled. The battery cell can also be simply referred to as a storage battery, and may be appropriately read as a storage battery as long as there is no contradiction. The storage battery system has a configuration in which a plurality of battery cells is connected in parallel or in series.

Figure 1:
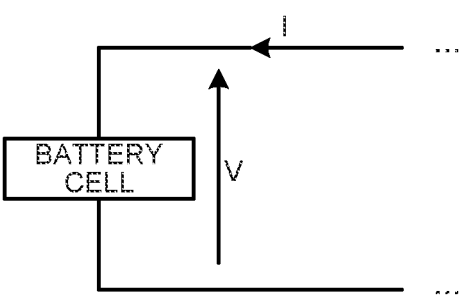
FIG. 1 schematically illustrates voltage and current of a battery cell.

FIG. 1 schematically illustrates voltage and current of a battery cell. The voltage of the battery cell is referred to as a battery voltage V, and illustrated. The current of the battery cell is referred to as a battery current I, and illustrated. The characteristics of the battery cell are represented by, for example, a Q-V curve (Q-V characteristics). The Q-V curve indicates the relation between the battery voltage V and an integrated current amount. The integrated current amount corresponds to a capacity (Q) according to coulomb counting, and the unit thereof is Ah.

Figure 2:
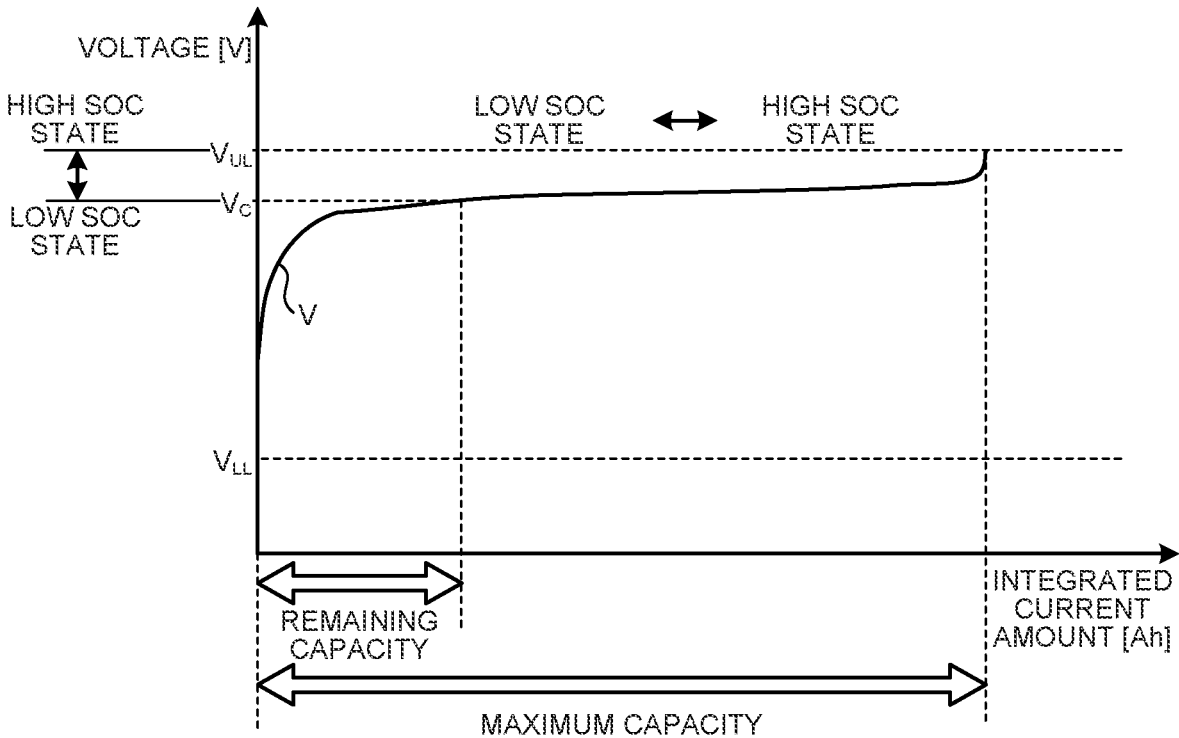
FIG. 2 illustrates an example of a Q-V curve.

FIG. 2 illustrates an example of the Q-V curve. The horizontal axis of the graph represents the integrated current amount (Ah), and the vertical axis represents the voltage (V). The battery voltage V changes in accordance with charging and discharging, that is, the integrated current amount. The battery cell is used at the battery voltage V within a determined range. The minimum voltage within the range is referred to as a lower limit voltage $V_{LL}$, and illustrated. The maximum voltage is referred to as an upper limit voltage $V_{UL}$, and illustrated.

When the battery voltage V is the lower limit voltage $V_{LL}$, the state of charge (SOC) of the battery cell is 0% (completely discharged state). When the battery voltage V is the upper limit voltage $V_{UL}$, the SOC is 100% (fully charged state). The maximum capacity of a battery cell DUT corresponds to an integrated current amount at the time when the battery cell is discharged from the upper limit voltage $V_{UL}$ to the lower limit voltage $V_{LL}$ or when the battery cell is charged from the lower limit voltage $V_{LL}$ to the upper limit voltage $V_{UL}$. Note that the rate (%) of the maximum capacity at the present time to an initial maximum capacity is also referred to as a state of health (SOH) or the like. The "capacity" may be appropriately read as the "SOH". The battery voltage V at any time point is referred to as a battery voltage $V_C$, and illustrated. The remaining capacity of the battery voltage $V_C$ corresponds to an integrated current amount at the time when the battery cell is charged from the lower limit voltage $V_{LL}$ to the battery voltage $V_C$ or when the battery cell is discharged from the battery voltage $V_C$ to the lower limit voltage $V_{LL}$.

A state with a relatively low SOC is referred to as a "low SOC state". A state with a relatively high SOC is referred to as a "high SOC state". Examples of the low SOC state include SOCs of less than approximately 50%, less than approximately 40%, less than approximately 30%, less than approximately 20%, and less than approximately 10%. Examples of the high SOC state include SOCs of approximately 50% or more, approximately 60% or more, approximately 70% or more, approximately 80% or more, and approximately 90% or more.

The storage battery system is desirably operated in a state in which cells are balanced from the viewpoint of securing an effective capacity and the like. The cell balance will be described with reference to FIGS. 3 and 4. A state in which cells are not balanced (out of balance) is referred to as an "imbalance state". A state in which cells are balanced is referred to as a "balanced state".

Figure 3:
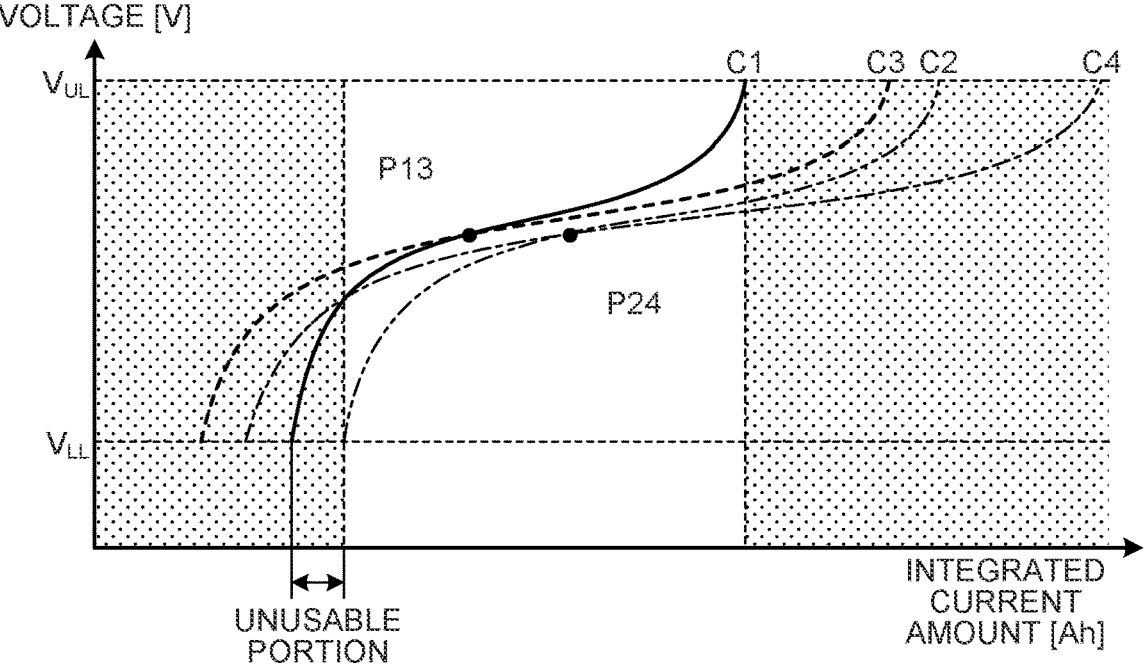
FIG. 3 illustrates an example of the Q-V curve in an imbalance state.

FIG. 3 illustrates an example of the Q-V curve in the imbalance state. Graph lines C1 to C4 represent Q-V curves of different battery cells. Note that the capacity increases in the order of the battery cells represented by the graph lines C1 to C4.

In the low SOC state, the battery cell represented by the graph line C2 has the smallest (lowest) battery voltage V. The smallest voltage of the battery voltages V of a plurality of battery cells is referred to as a minimum voltage $V_{MIN}$. When the minimum voltage $V_{MIN}$ reaches the lower limit voltage $V_{LL}$, the battery cells represented by the remaining graph lines C1, C3, and C4 cannot be discharged any more despite the fact that the battery voltage V has not reached the lower limit voltage $V_{LL}$.

In the high SOC state, the battery cell represented by the graph line C1 has the largest (highest) battery voltage V. The largest voltage of the battery voltages V of a plurality of battery cells is referred to as a maximum voltage $V_{MAX}$. When the maximum voltage $V_{MAX}$ reaches the upper limit voltage $V_{UL}$, the battery cells represented by the remaining graph lines C2 to C4 cannot be charged any more despite the fact that the battery voltage V has not reached the upper limit voltage $V_{UL}$.

In the imbalance state, the battery cell having the minimum voltage $V_{MIN}$ in the low SOC state is different from the battery cell having the maximum voltage $V_{MAX}$ in the high SOC state. In the high SOC state, the battery cell (graph line C1) having the maximum voltage $V_{MAX}$ cannot be discharged up to the lower limit voltage $V_{LL}$. The portion that cannot be discharged (unusable portion) causes a decrease in effective capacity.

Figure 4:
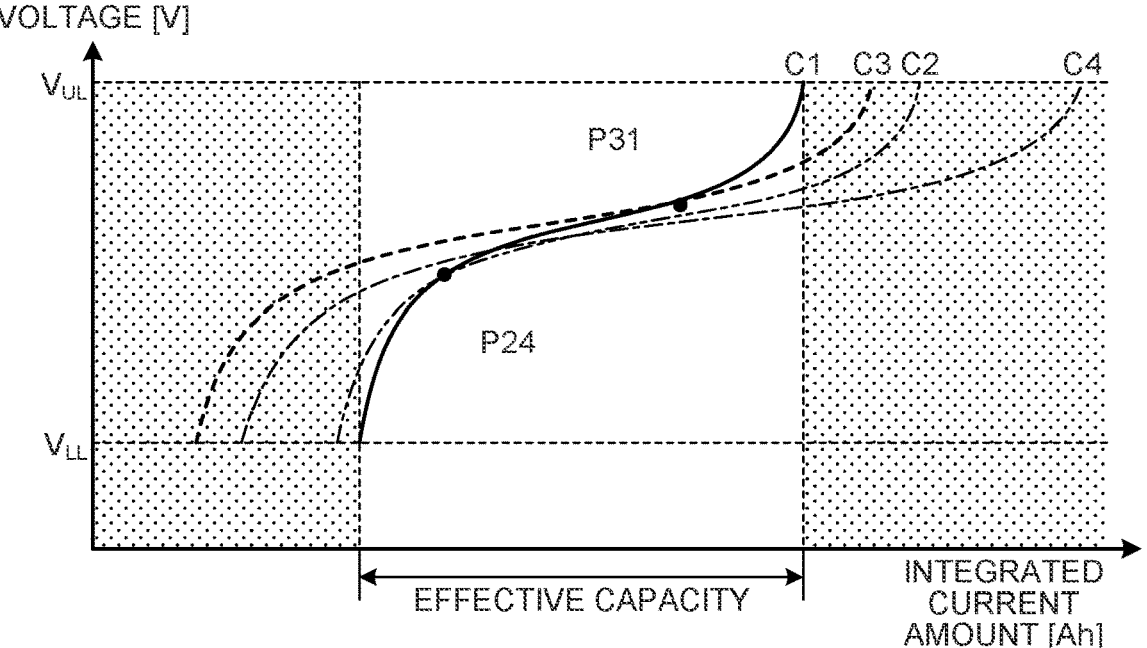
FIG. 4 illustrates an example of the Q-V curve in a balanced state.

FIG. 4 illustrates an example of the Q-V curve in the balanced state. In the low SOC state, the battery cell represented by the graph line C1 has a battery voltage V of the minimum voltage $V_{MIN}$. In the high SOC state, the battery cell represented by the graph line C1 has a battery voltage V of the maximum voltage $V_{MAX}$.

In the balanced state, the battery cell having the minimum voltage $V_{MIN}$ in the low SOC state is the same as the battery cell having the maximum voltage $V_{MAX}$ in the high SOC state. In this case, the same battery cell can be charged from the lower limit voltage $V_{LL}$ to the upper limit voltage $V_{UL}$, and can be discharged from the upper limit voltage $V_{UL}$ to the lower limit voltage $V_{LL}$. Accordingly, an effective capacity is easily secured.

It is difficult to actually measure the maximum capacity in a common storage battery system for various reasons. For example, an actual storage battery system is not used in a range of an SOC of 0 to 100% in order to have a margin or extend a life. A storage battery system always used for system stabilization and the like has difficulty in having a period for full charging and discharging. In order to perform full charging and discharging, it takes two hours at a charging and discharging rate of 1 C, and 10 hours at a charging and discharging rate of 0.2 C. In a storage battery system having a plurality of battery cells connected in series, each battery cell cannot be fully charged and discharged in an imbalance state, and thus the maximum capacity of each battery cell cannot be actually measured.

From the above, in an actual storage battery system, the maximum capacity is displayed by the following methods. For example, there is a method of statistically reducing the maximum capacity in accordance with conditions such as an operating time and the number of charging and discharging cycles. In the method, unfortunately, the displayed maximum capacity does not coincide with the actual maximum capacity when an unexpected battery cell is used. There is a method of preliminarily setting the maximum capacity with a margin. In the method, unfortunately, a battery cell is not effectively used. Although a method of periodically performing full charging and discharging and actually measuring and reflecting the maximum capacity may be used, the storage battery system may fail to be used. Factors of a decrease in effective capacity due to variations of individual battery cells cannot be considered.

In addition, not a few storage battery systems output data of only some (i.e., two or more but not all) of a plurality of battery cells. According to the disclosed technique, a storage battery system can be diagnosed from data of some battery cells.

Example

Figure 5:
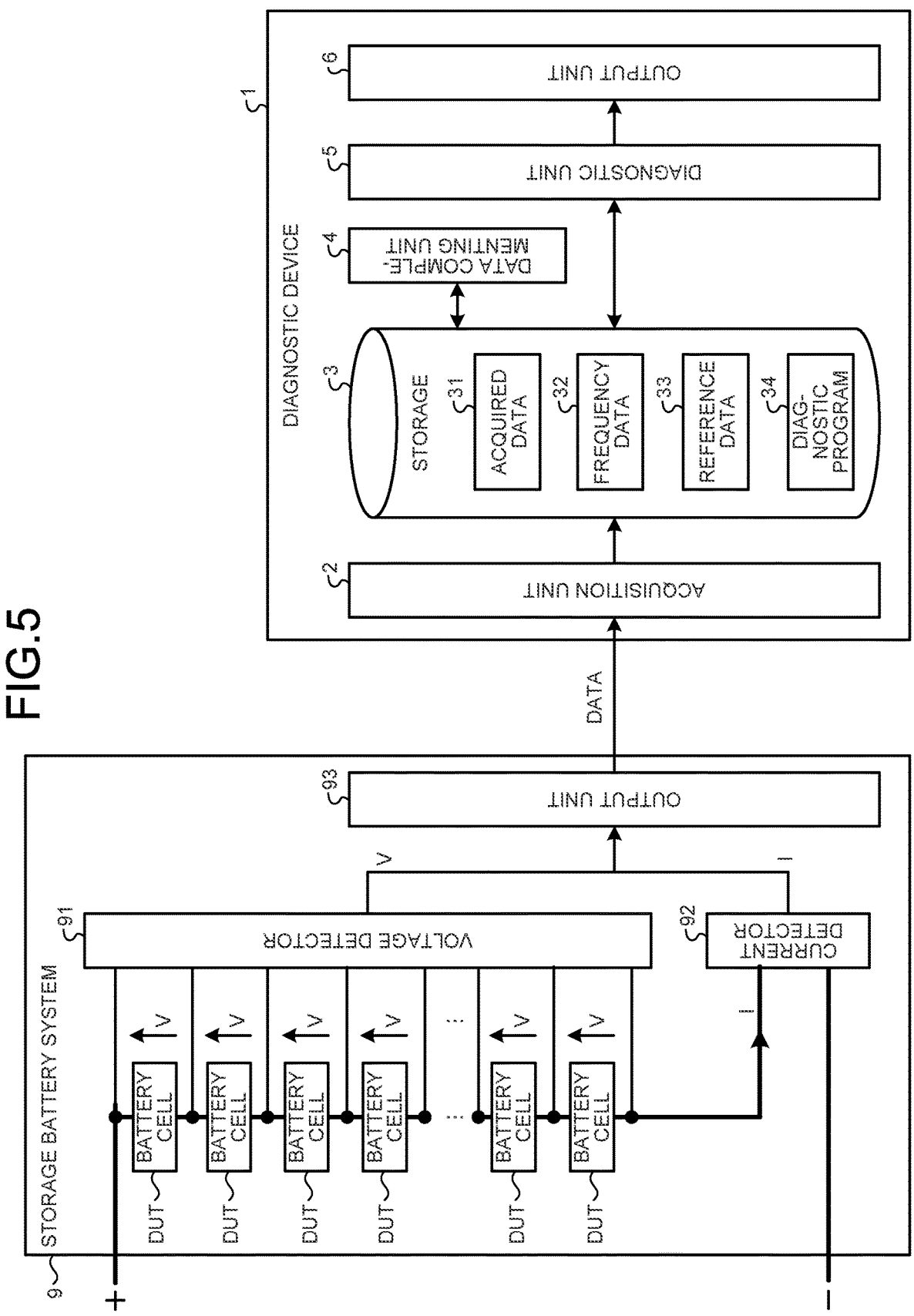
FIG. 5 illustrates an example of a schematic configuration of a diagnostic device according to one or more embodiments.

FIG. 5 illustrates an example of a schematic configuration of a diagnostic device according to one or more embodiments. First, a storage battery system 9 to be diagnosed by a diagnostic device 1 will be described, and then the diagnostic device 1 will be described.

The storage battery system 9 includes a plurality of battery cells DUT, a voltage detector 91, a current detector 92, and an output unit 93. In this example, the plurality of battery cells DUT is connected in series. The storage battery system 9 is also referred to as an assembled battery, an energy storage system (ESS), or the like.

The voltage detector 91 detects the battery voltage V of each of the plurality of battery cells DUT. The voltage detector 91 includes, for example, a voltmeter (not illustrated). The current detector 92 detects the battery current I of the battery cells DUT. Since the battery cells DUT are connected in series, the battery current I is common to the battery cells DUT. The current detector 92 includes, for example, an ammeter (not illustrated). Detection results of the voltage detector 91 and the current detector 92 are sent to the output unit 93.

The output unit 93 outputs data of some (i.e., two or more but not all) of the plurality of battery cells DUT. For example, the output unit 93 outputs data of a battery cell DUT having the maximum voltage $V_{MAX}$ and data of a battery cell DUT having the minimum voltage $V_{MIN}$, but not data of any of the other battery cells DUT. In addition, when there is a preliminarily designated battery cell DUT, the output unit 93 may also output data of the battery cell DUT.

The data is output with a predetermined period, for example. Examples of the period include several seconds, several tens of seconds, and several minutes. Examples of the data include the battery voltage V (e.g., maximum voltage $V_{MAX}$ and minimum voltage $V_{MIN}$), an integrated current amount, a SOC, and a cell ID of the battery cell DUT. The integrated current amount is determined by integrating the battery current I detected by the current detector 92. The SOC is determined by using various known methods. The cell ID is an identifier for specifying the battery cell DUT.

The diagnostic device 1 will be described. The diagnostic device 1 includes an acquisition unit 2, a storage 3, a data complementing unit 4, a diagnostic unit 5, and an output unit 6.

The acquisition unit 2 acquires data of the battery cell DUT output by the output unit 93 of the storage battery system 9. Since the output unit 93 outputs data of only some battery cells DUT, the acquisition unit 2 acquires data of only those battery cells DUT. Here, there is relation between the features of the battery cells DUT and data acquisition patterns, and thus the battery cells DUT can be classified for the data acquisition patterns. This will be described with reference to FIGS. 6 and 7.

FIG. 6 illustrates an example of the classification of battery cells in a balanced state. A battery cell DUT is classified into any of classifications 1 to 7. A battery cell DUT that is acquired in data as a battery cell DUT having the minimum voltage $V_{MIN}$ is referred to as a MIN cell. A battery cell DUT that is acquired in data as a battery cell DUT having the maximum voltage $V_{MAX}$ is referred to as a MAX cell.

In many cases, a battery cell DUT of the classification 1 is acquired in data as a MIN cell in a low SOC state, and acquired in data as a MAX cell in a high SOC state. The battery cell DUT has the minimum and most deteriorated capacity. Data in a wide range of the Q-V curve is acquired.

In many cases, a battery cell DUT of the classification 2 is acquired in data as the MAX cell in the low SOC state, and acquired in data as the MIN cell in the high SOC state. The battery cell DUT has the maximum and least deteriorated capacity. Data in a wide range of the Q-V curve is acquired.

A battery cell DUT of the classification 3 may be acquired in data as the MAX cell in the low SOC state. A battery cell DUT of the classification 4 may be acquired in data as the MAX cell in the high SOC state. A battery cell DUT of the classification 5 may be acquired in data as the MIN cell in the low SOC state. A battery cell DUT of the classification 6 may be acquired in data as the MIN cell in the high SOC state. Although the battery cells DUT of the classifications 3 to 6 have an average capacity, the SOCs thereof are shifted from an average SOC. The battery cells DUT of the classifications 3 and 4 are shifted in a direction in which the SOCs are increased (Q-V curves thereof are shifted to the left). The battery cells DUT of the classifications 5 and 6 are shifted in a direction in which the SOCs are decreased (Q-V curves thereof are shifted to the right).

A battery cell DUT of the classification 7 is hardly acquired in data. The battery cell DUT has an average capacity, and the SOC thereof is less shifted than those of the battery cells DUT of the classifications 3 to 6.

FIG. 7 illustrates an example of the classification of a battery cell in an imbalance state. A battery cell DUT is classified into any of classifications 11 to 17.

A battery cell DUT of the classification 11 is often acquired in data as a MAX cell in any of the low SOC state and the high SOC state. The battery cell DUT is shifted in a direction in which the SOC thereof is increased.

A battery cell DUT of the classification 12 is often acquired in data as a MIN cell in any of the low SOC state and the high SOC state. The battery cell DUT is shifted in a direction in which the SOC thereof is decreased.

A battery cell DUT of the classification 13 is often acquired in data as the MAX cell in the low SOC state. A battery cell DUT of the classification 14 is often acquired in data as the MAX cell in the high SOC state. A battery cell DUT of the classification 15 is often acquired in data as the MIN cell in the low SOC state. A battery cell DUT of the classification 16 is often acquired in data as the MIN cell in the high SOC state. The battery cell DUT of the classification 13 has a larger capacity than the battery cell DUT of the classification 11, and is shifted in a direction in which the SOC thereof is increased. The battery cell DUT of the classification 14 has a smaller capacity than the battery cell DUT of the classification 11, and is shifted in a direction in which the SOC thereof is increased. The battery cell DUT of the classification 15 has a smaller capacity than the battery cell DUT of the classification 12, and is shifted in a direction in which the SOC thereof is decreased. The battery cell DUT of the classification 16 has a larger capacity than the battery cell DUT of the classification 12, and is shifted in a direction in which the SOC thereof is decreased.

A battery cell DUT of the classification 17 is hardly acquired in data. The battery cell DUT has an average capacity, and the SOC thereof is less shifted than those of the battery cells DUT of the classifications 13 to 16.

As described above, a battery cell DUT having a feature different from that of an average battery cell DUT in relation to a capacity and an SOC shift is often acquired in data as the MAX cell or the MIN cell in at least one of the low SOC state or the high SOC state. In diagnosing the storage battery system 9, monitoring (acquiring in data) and diagnosing these battery cells DUT are important. In contrast, the need for monitoring and diagnosing average battery cells DUT (classifications 7 and 17) is low. That is, if there is data of some battery cells DUT acquired by the acquisition unit 2 (FIG. 5), the storage battery system 9 can be diagnosed.

Returning to FIG. 5, the storage 3 stores various pieces of information necessary for processing executed in the diagnostic device 1. Examples of the stored information include acquired data 31, frequency data 32, reference data 33, and a diagnostic program (diagnostic instructions) 34.

The acquired data 31 is acquired by the acquisition unit 2. The acquired data 31 is acquired after the start of operation of the storage battery system 9, that is, during operation, and corresponds to at least a part of Q-V curves of some battery cells DUT.

Figure 8:
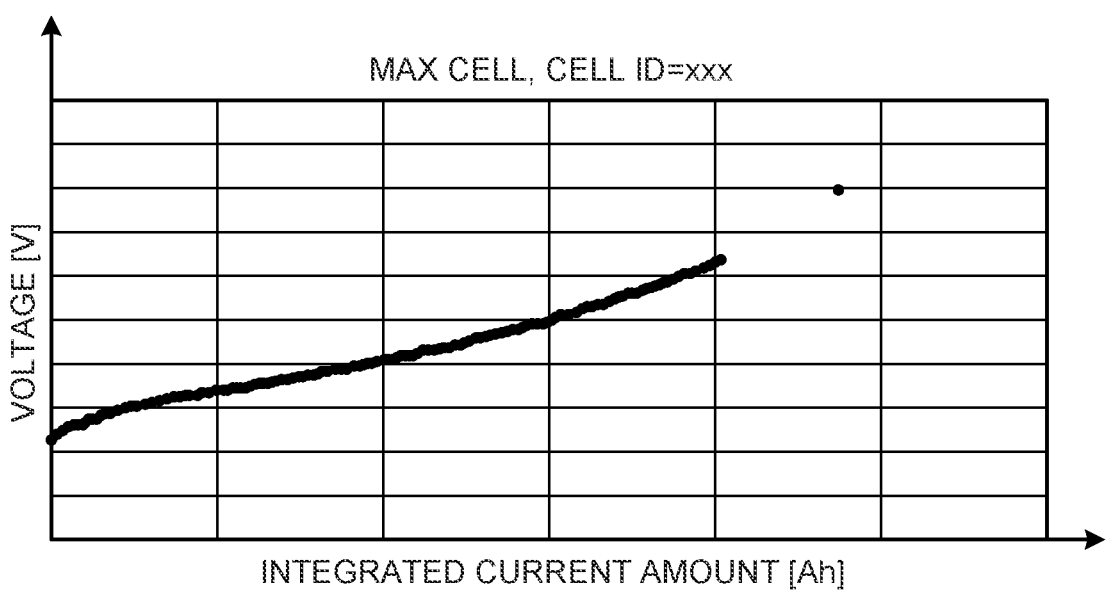
FIG. 8 illustrates an example of acquired data.
Figure 9:
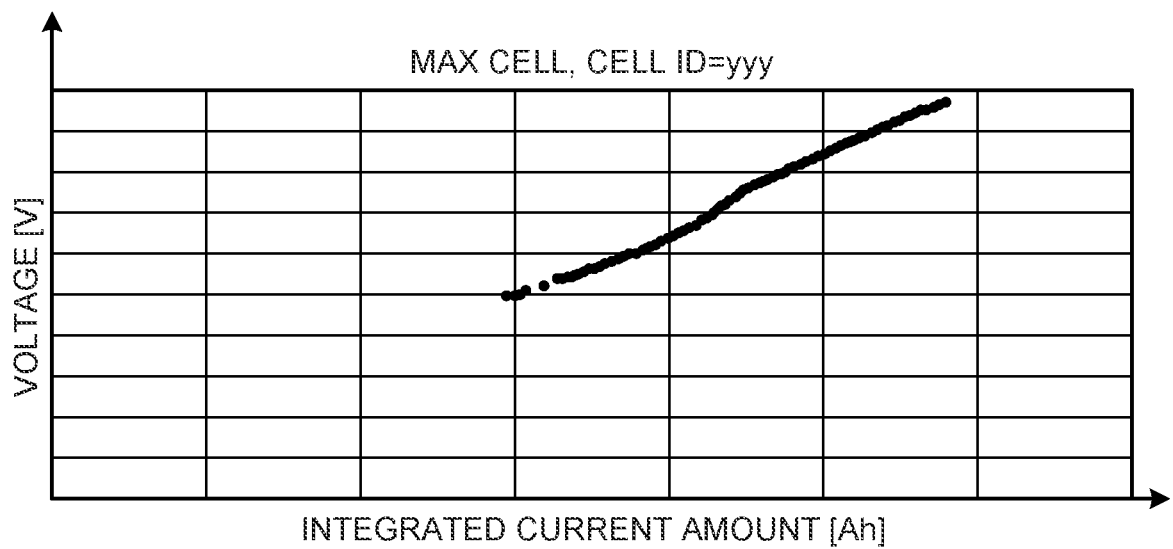
FIG. 9 illustrates an example of the acquired data.

FIGS. 8 and 9 illustrate examples of acquired data. FIG. 8 illustrates data of the battery cell DUT of the classification 13 (schematically illustrates data thereof with cell ID=xxx). A lot of data is acquired in the low SOC state. FIG. 9 illustrates data of the battery cell DUT of the classification 14 (schematically illustrates data thereof with cell ID=yyy). A lot of data is acquired in the high SOC state. Battery cells DUT of other classifications are acquired in data as described above with reference to FIGS. 6 and 7.

Returning to FIG. 5, the frequency data 32 indicates a data acquisition frequency for each battery cell DUT. For example, the acquisition unit 2 counts the number of times of data acquisitions for each battery cell DUT. The count result is stored in the storage 3 as the frequency data 32.

Figure 10:
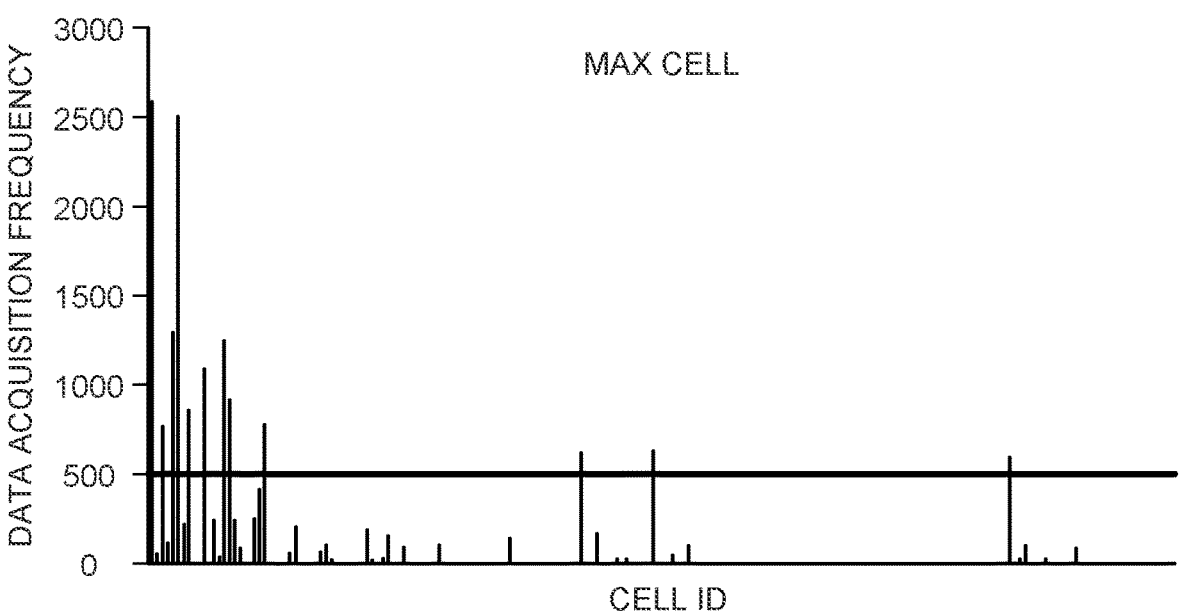
FIG. 10 illustrates an example of frequency data.
Figure 11:
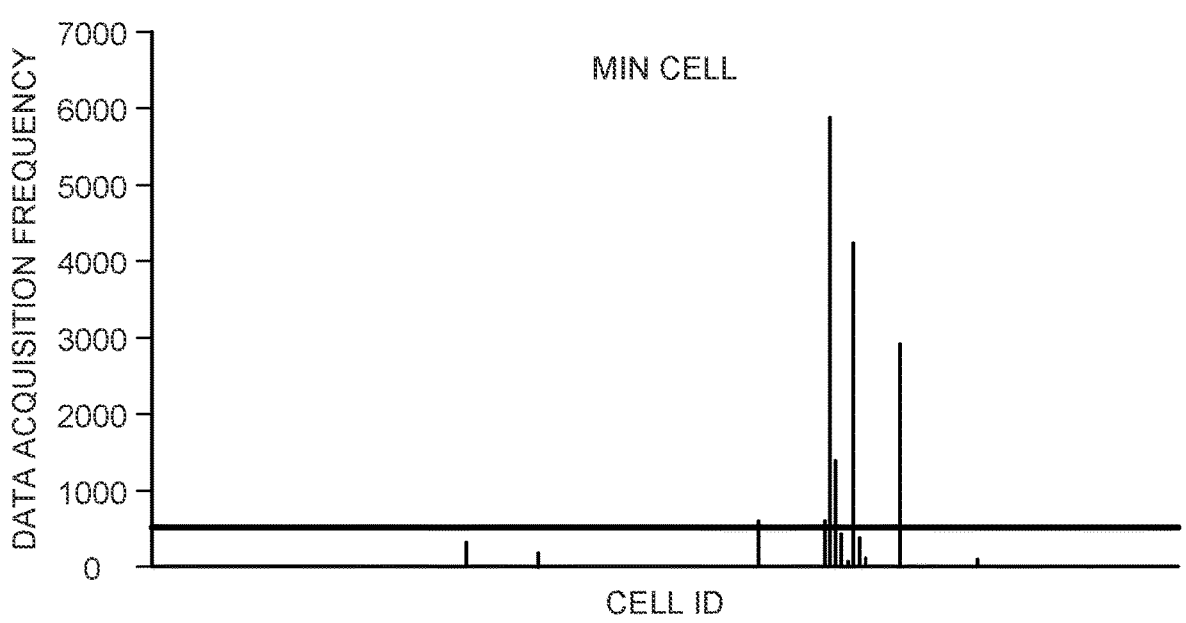
FIG. 11 illustrates an example of the frequency data.

FIGS. 10 and 11 illustrate examples of the frequency data. The number of battery cells DUT reaches several hundreds (there are several hundreds of types of data IDs). FIG. 10 illustrates a data acquisition frequency (number of times of acquisitions) of a MAX cell in one charging operation. FIG. 11 illustrates a data acquisition frequency of a MIN cell in one charging operation.

As will be understood, most battery cells DUT are never acquired in data. These battery cells DUT are average battery cells DUT mainly classified into the classifications 7 and 17, and has low need for management. Even in a case of a battery cell DUT that has been acquired in data once or more, a low data acquisition frequency thereof still causes low need for management. In contrast, a battery cell DUT having a data acquisition frequency that is high to some extent is classified into the classifications 1 to 6 and 11 to 16, and can be to be managed. Only data that can be to be managed may be selected, and used for diagnosing the storage battery system 9. Threshold determination may be adopted for data selection. Data of a battery cell DUT having a data acquisition frequency equal to or greater than a threshold is selected. Graphs of FIGS. 10 and 11 illustrate lines of threshold=500 as an example of the threshold.

Returning to FIG. 5, the reference data 33 serves as a standard (is to be compared) for capacity deterioration of a battery cell DUT, and includes, for example, data corresponding to the Q-V curve. The reference data 33 may be based on an actual measurement value of a battery cell DUT before progress of capacity deterioration. For example, at the start of operation of the storage battery system 9, the storage battery system 9 are fully charged and discharged at a predetermined charging and discharging rate (charged and discharged at SOC=0 to 100%). During the time, the storage 3 stores, as the reference data 33, data of a specific battery cell DUT, for example, a battery cell DUT of the classification 1 or classification 2 among data acquired by the acquisition unit 2. Note that, when a part of the data is missing and needs complementation, the data complementing unit 4 to be described later complements the data.

The diagnostic program 34 causes a computer to execute processing of the diagnostic device 1, for example, processing performed by the acquisition unit 2 and the diagnostic unit 5 and the output unit 6 to be described later (e.g., acquisition processing, diagnostic processing, and output processing). At least a part of the functions of the diagnostic device 1 is implemented by operating a general-purpose computer in accordance with the diagnostic program 34, for example. The computer includes, for example, a communication device, a display device, a storage device, a memory, and a processor, which are connected to each other by a bus or the like. The processor reads the diagnostic program 34 from the storage device or the like, and develops the diagnostic program 34 in the memory, thereby causing the computer to function as the diagnostic device 1. Note that the diagnostic program 34 may be distributed via a network such as the Internet. The diagnostic program 34 may be recorded in a non-transitory computer-readable recording medium such as a hard disk, a flexible disk (FD), a CD-ROM, a magneto-optical (MO) disk, and a digital versatile disc (DVD). Note that, of course, dedicated hardware that operates in accordance with the diagnostic program 34 may be used instead of the general-purpose computer.

Measurement data (acquired data 31 and reference data 33) acquired by the acquisition unit 2 is used for complementation performed by the data complementing unit 4 and diagnosis performed by the diagnostic unit 5. In one or more embodiments, only measurement data of a specific battery cell DUT among pieces of measurement data acquired by the acquisition unit 2 may be selected and used. The above-described threshold determination may be adopted for data selection. For example, the data complementing unit 4 complements data of a battery cell DUT having a data acquisition frequency equal to or greater than a threshold. The diagnostic unit 5 diagnoses the storage battery system 9 based on the data of a battery cell DUT having a data acquisition frequency equal to or greater than a threshold.

The data complementing unit 4 complements measurement data of one battery cell DUT in the acquired data 31 so as to obtain a Q-V curve that can be used for calculation in (capacity calculator 522 of calculator 52 of) the diagnostic unit 5 to be described later. Although a method of complementation is not particularly limited, linear interpolation, complementation using a multi-order expression, and the like may be adopted. Measurement data of one battery cell in the acquired data 31 may be complemented by using data of another battery cell in the acquired data 31. A different complementation method may be adopted for each missing portion of the measurement data.

Figure 12:
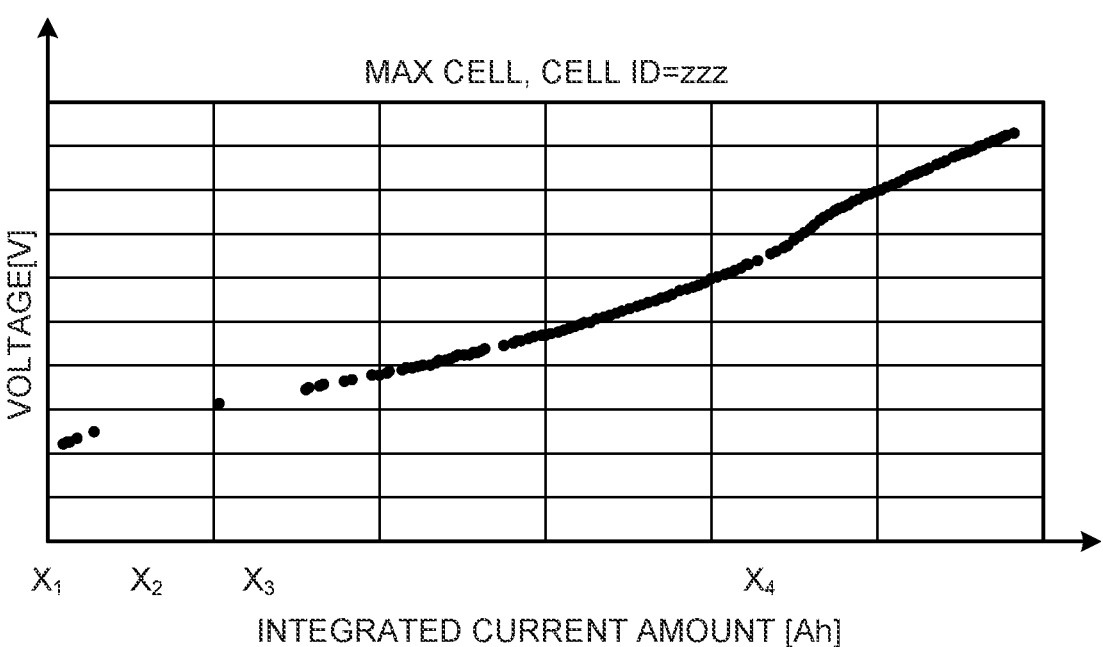
FIG. 12 illustrates an example of complementation of reference data.

FIG. 12 illustrates an example of complementation of acquired data. Data of a certain battery cell DUT (schematically illustrated as cell ID=zzz) is illustrated. Parts of data corresponding to a Q-V curve, in this example, pieces of data in the vicinities of integrated current amount=$X_1$Ah, integrated current amount=$X_2$Ah, and integrated current amount=$X_3$Ah are missing. This is considered to be because other battery cells DUT having substantially the same voltage are acquired in data as the MAX cell and the MIN cell due to influence of noise and the like. The missing parts can be complemented by replacing the missing parts with other battery cells DUT. Although data is missing in the vicinity of integrated current amount=$X_4$Ah, measurement data before and after the missing portion is obtained. Thus, linear interpolation and complementation using a polynomial and the like generated by the surrounding measurement data may be adopted.

Complementation to perform replacement with other battery cells DUT will be further described. For example, data of a battery cell DUT of one of the classifications 3 and 6 described above with reference to FIG. 6 may be complemented by data of a battery cell DUT of the other classification. These battery cells DUT are considered to have substantially the same level of capacity, and appropriate complementation is possible. A battery cell DUT of one of the classifications 4 and 5 may be complemented by data of a battery cell DUT of the other classification. These battery cells DUT are also considered to have substantially the same level of capacity, and appropriate complementation is possible.

Returning to FIG. 5, furthermore, when a part of the reference data 33 (part of Q-V curve) is missing, the data complementing unit 4 also complements the reference data 33. The complementation method may be similar to that described above. Note that the reference data 33 complemented by the data complementing unit 4 is also simply referred to as the reference data 33.

The diagnostic unit 5 diagnoses the storage battery system 9 based on data acquired by the acquisition unit 2, that is, the acquired data 31 and the reference data 33.

Figure 13:
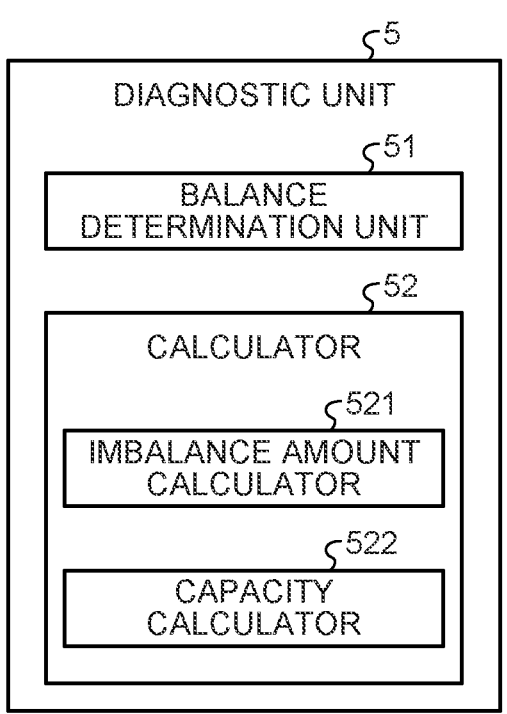
FIG. 13 illustrates an example of a schematic configuration of a diagnostic unit according to one or more embodiments.

FIG. 13 illustrates an example of a schematic configuration of the diagnostic unit. The diagnostic unit 5 includes a balance determination unit 51 and the calculator 52.

The balance determination unit 51 determines which of the balanced state or the imbalance state the cell balance of the storage battery system 9 is in based on the acquired data 31. For example, the determination is made based on the similarity and difference between the battery cell DUT acquired in data as the MIN cell in the low SOC state and the battery cell DUT acquired in data as the MAX cell in the high SOC state. In that case, the balance determination unit 51 may determine that the cell balance is in the balanced state when there is a battery cell DUT (battery cell DUT of classification 1), which is often acquired in data as the MIN cell in the low SOC state and often acquired in data as the MIN cell in the high SOC state. When there is no such battery cell DUT, the balance determination unit 51 may determine that the cell balance is in the imbalance state.

The calculator 52 calculates values related to the cell balance and capacity of the storage battery system 9. The calculator 52 includes an imbalance amount calculator 521 and the capacity calculator 522.

The imbalance amount calculator 521 calculates an imbalance amount as the name thereof indicates. The imbalance amount is an index indicating deviation between integrated current amounts of a plurality of battery cells DUT in the imbalance state.

Figure 14:
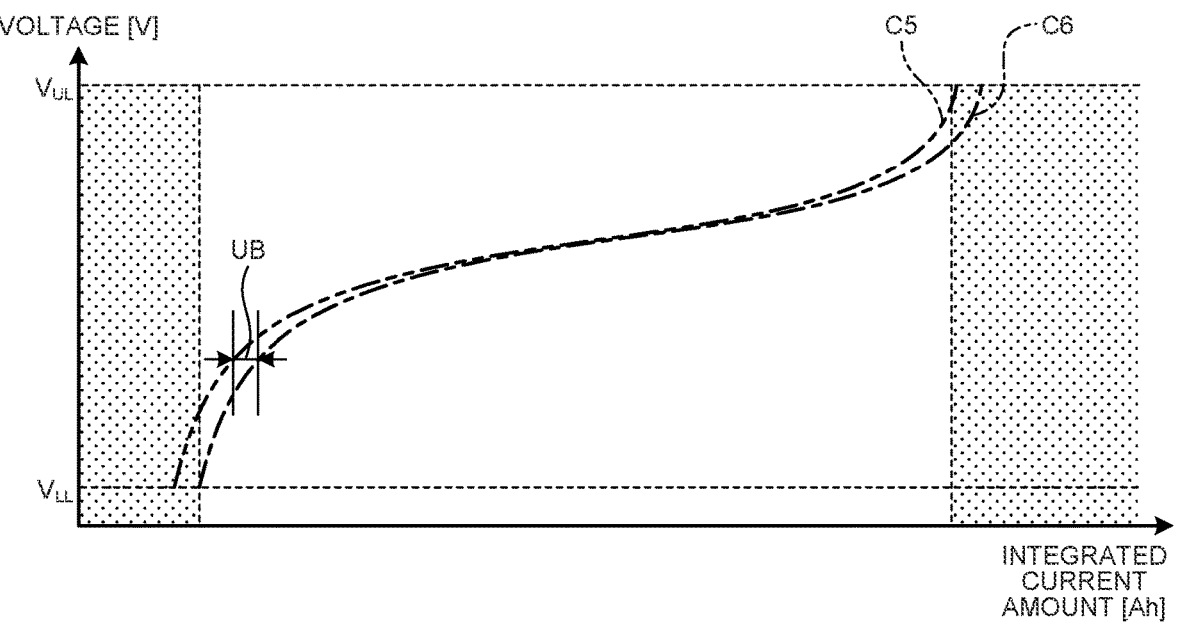
FIG. 14 illustrates an example of an imbalance amount.

FIG. 14 illustrates an example of the imbalance amount. The imbalance amount is referred to as an imbalance amount UB, and illustrated. When viewed at the same voltage, the integrated current amount of the battery cell DUT indicated by a graph line C5 is different from the integrated current amount of the battery cell DUT indicated by a graph line C6. The imbalance amount UB is calculated as a difference between integrated current amounts of battery cells DUT having the same voltage. Although, in this example, the imbalance amount UB is calculated from two battery cells DUT, any imbalance amount UB between three or more battery cells DUT may be calculated. Furthermore, the imbalance amount UB at each of a plurality of different voltages may be calculated. The relative magnitude of the capacity deviation between a plurality of battery cells DUT is grasped from the magnitude of the imbalance amount UB. The direction of capacity deviation between a plurality of battery cells DUT is grasped from the sign (positive or negative) of the imbalance amount UB.

Returning to FIG. 13, the capacity calculator 522 calculates a value related to the capacity of the battery cell DUT. In one or more embodiments, the capacity calculator 522 calculates a value related to the capacity of the battery cell DUT based on a result of comparison between the Q-V curve obtained from the acquired data 31 and the Q-V curve obtained from the reference data 33. The Q-V curve obtained from the acquired data 31 is also referred to as a "measurement Q-V curve". The measurement Q-V curve can also be referred to as a Q-V curve after capacity deterioration. The Q-V curve obtained from the reference data 33 is also referred to as a "reference Q-V curve". The reference Q-V curve can also be referred to as a Q-V curve before capacity deterioration.

Figure 15:
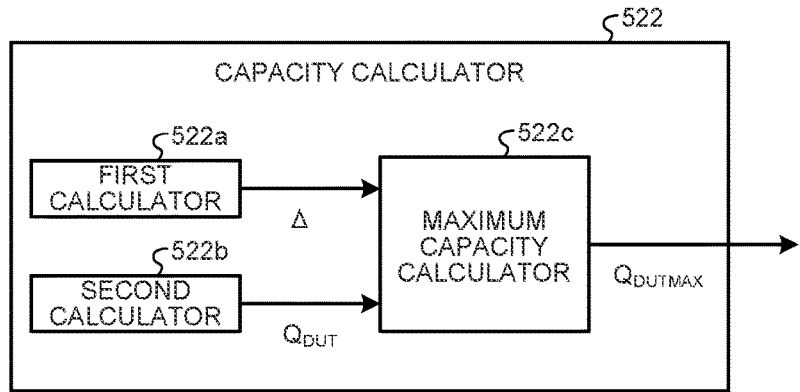
FIG. 15 illustrates an example of a schematic configuration of a capacity calculator according to one or more embodiments.

FIG. 15 illustrates an example of a schematic configuration of the capacity calculator. The capacity calculator 522 includes, as functional blocks, a first calculator 522*a*, a second calculator 522*b*, and a maximum capacity calculator 522*c*. A specific calculation method will be described with reference to FIGS. 16 and 17.

Figure 16:
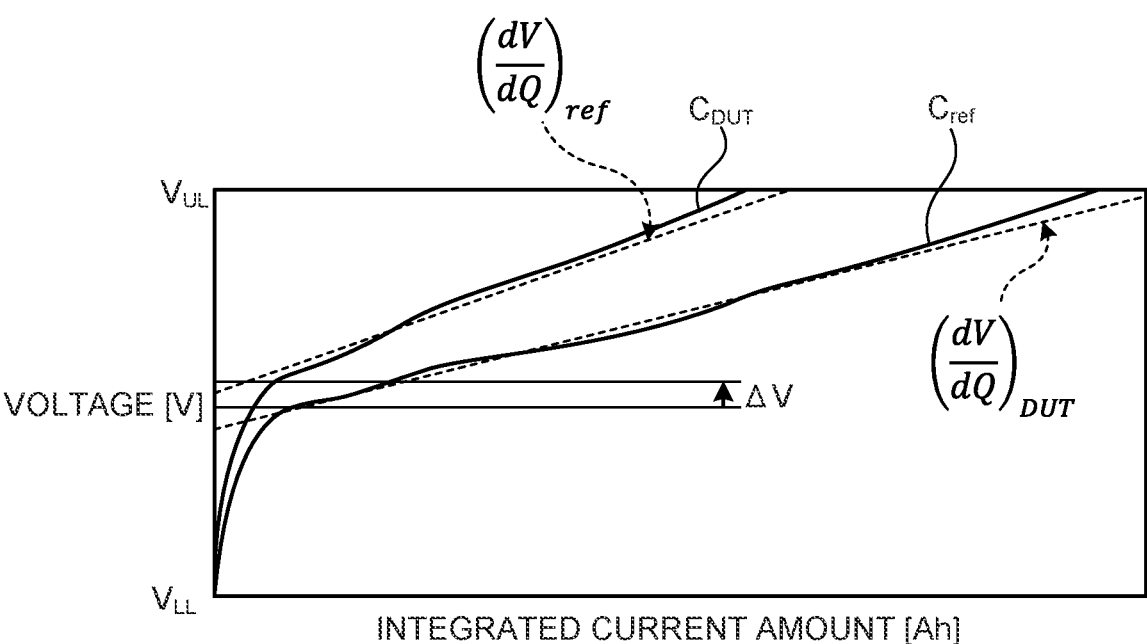
FIG. 16 illustrates an example of a reference Q-V curve and a measurement Q-V curve.

FIG. 16 illustrates an example of the reference Q-V curve and the measurement Q-V curve. A graph line $C_{ref}$ represents a reference Q-V curve. A graph line $C_{DUT}$ represents a measurement Q-V curve. The lower limit voltage $V_{LL}$ is, for example, approximately 2.8 V, and the upper limit voltage $V_{UL}$ is, for example, approximately 4.2 V. When the graph line $C_{ref}$ is compared with the graph line $C_{DUT}$, the factor of the capacity deterioration of a battery cell DUT can described by dividing the factor into two factors.

The first factor is a change in magnitude of the battery voltage V (shift of battery voltage V in vertical axis direction). The larger battery voltage V accelerates arrival to the upper limit voltage $V_{UL}$, and decreases the maximum capacity. For example, in a case of a lithium-ion battery, deviation of a positive electrode potential and a negative electrode potential from an initial design value appears as a shift of the battery voltage V. The deviation is generated by deterioration derived from immobilization of Li in the negative electrode and the like. The immobilization occurs due to charging and discharging operation of a battery cell and the battery cell being left in a charged state.

The second factor is a change in inclination of the battery voltage V. The larger inclination accelerates arrival to the upper limit voltage $V_{UL}$, and decreases the maximum capacity. A decrease in capacity of a deactivation factor due to immobilization of an active material and the like appears as a change in inclination of the battery voltage V. As also illustrated in FIG. 16, in a case of a battery cell using materials having a plurality of capacity holding potentials such as a ternary system in combination, the battery voltage V increases relatively monotonically as the integrated current amount increases. When the battery cell having such characteristics is deactivated or deteriorates in capacity due to partial destruction of an electrode structure, the degree of increase in the battery voltage V to the integrated current amount, that is, inclination increases. The battery voltage V greatly changes even with a small integrated current amount.

The first calculator 522a calculates a capacity deterioration amount caused by the above-described first factor (potential deviation between positive and negative electrodes), that is, the voltage difference between the measurement Q-V curve (graph line $C_{DUT}$) and the reference Q-V curve (graph line $C_{ref}$). The capacity deterioration amount is referred to as a "capacity deterioration amount $\Delta Q$". The voltage difference is referred to as a "voltage difference $\Delta V$". For example, the first calculator 522a calculates the difference between the voltages at feature points of the differential curves of the measurement Q-V curve and the reference Q-V curve as the voltage difference $\Delta V$.

Figure 17:
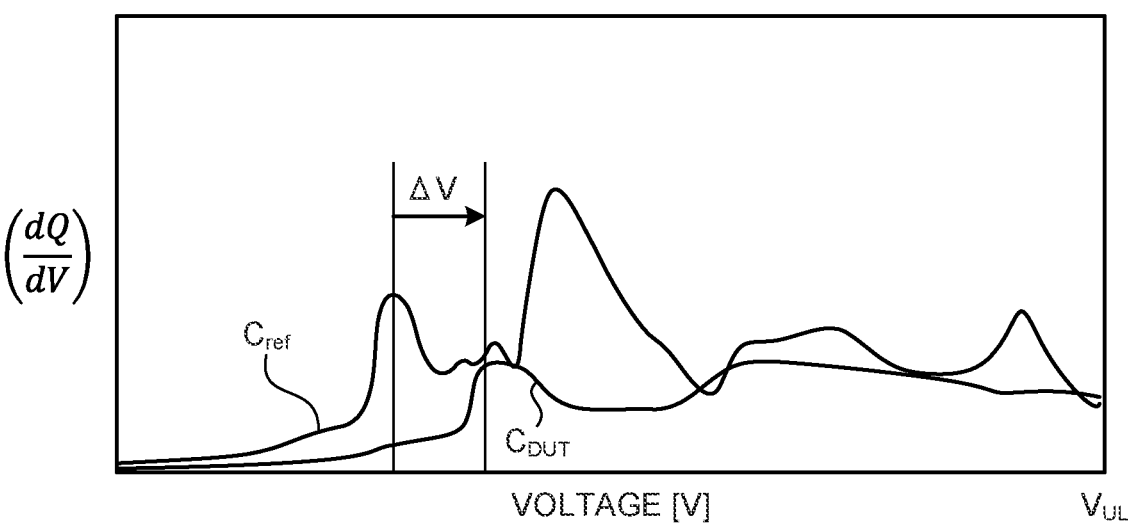
FIG. 17 illustrates an example of a differential curve.

FIG. 17 illustrates an example of the differential curves. The graph line $C_{ref}$ and the graph line $C_{DUT}$ correspond to the differential curves of the graph line $C_{ref}$ and the graph line $C_{DUT}$ in FIG. 16, respectively. In this example, the difference between the voltages of local maximum values that first appear in the two differential curves is calculated as the voltage difference $\Delta V$. Note that the local maximum value may be interpreted to include the maximum value.

The first calculator 522a calculates the capacity deterioration amount $\Delta Q$ caused by the voltage difference $\Delta V$ by multiplying the inclination of the Q-V curve, more specifically, the inclination of the integrated current amount to the battery voltage V (dQ/dV) by the voltage difference $\Delta V$. For example, Expression (1) below is used. The inclination (dQ/dV) used for the multiplication here may be an inclination in a case where the battery voltage V is equal to or greater than the voltage at a feature point. An inclination in a region near the upper limit voltage $V_{UL}$ may be used. For example, when the upper limit voltage $V_{UL}$ is 4.2 V and the voltage difference $\Delta V$ is 0.05 V, an average inclination from 4.15 V to 4.2 V may be used.

$$\Delta Q = \left( \frac{dQ}{dV} \right) \cdot \Delta V \tag{1}$$

The second calculator 522b calculates the maximum capacity after capacity deterioration caused by the above-described second factor (deactivation), that is, a change in inclination of the measurement Q-V curve to the inclination of the reference Q-V curve. The maximum capacity here is a temporary maximum capacity in consideration of only the second factor, and thus referred to as a "temporary maximum capacity $Q_{DUT}$".

Specifically, referring to FIG. 16 again, the second calculator 522b calculates the inclination (dV/dQ) of the battery voltage V to the integrated current amount for each of the reference Q-V curve (graph line $C_{ref}$) and the measurement Q-V curve (graph line $C_{DUT}$). The inclination calculated here may be an inclination in a case where the battery voltage V is equal to or greater than the voltage at a feature point. An inclination (dV/dQ) in a voltage range with a relatively high SOC (e.g., approximately 3.8 to 4.0 V) may be calculated. This is because, for example, when a negative electrode is made of graphite, a region (region also referred to as stage 1, stage 2, and the like) having excellent capacity holding capability of the negative electrode contributes to a high SOC state side, and deactivation of a positive electrode active material is considered to be more visible in deterioration of the high SOC state side.

In FIG. 16, a straight line having the calculated inclination of the reference Q-V curve (graph line $C_{ref}$) is indicated by a broken line as $(dV/dQ)_{ref}$. A straight line having the calculated inclination of the measurement Q-V curve (graph line $C_{DUT}$) is indicated by a broken line as $(dV/dQ)_{DUT}$.

The second calculator 522b calculates the temporary maximum capacity $Q_{DUT}$ by multiplying the ratio between the calculated inclination of the measurement Q-V curve and the calculated inclination of the reference Q-V curve by a reference maximum capacity $Q_{ref}$. For example, Expression (2) below is used. The reference maximum capacity $Q_{ref}$ is a maximum capacity obtained from the reference Q-V curve, and corresponds to the maximum capacity of the battery cell DUT before deterioration.

$$Q_{DUT} = \frac{\left( \frac{dV}{dQ} \right)_{ref}}{\left( \frac{dV}{dQ} \right)_{DUT}} \cdot Q_{ref} \tag{2}$$

The maximum capacity calculator 522c calculates a maximum capacity $Q_{DUTMAX}$ of the battery cell DUT by subtracting the capacity deterioration amount $\Delta Q$ calculated by the first calculator 522a from the temporary maximum capacity $Q_{DUT}$ calculated by the second calculator 522b. For example, Expression (3) below is used. The maximum capacity $Q_{DUTMAX}$ calculated in this way is a maximum capacity in consideration of both the first factor (potential deviation between positive and negative electrodes) and the second factor (deactivation) described above.

$$Q_{DUTMAX} = Q_{DUT} - \Delta Q \tag{3}$$

A part of data of the Q-V curve of the battery cell DUT is sufficient for the acquired data 31 necessary for calculation performed by the first calculator 522a, the second calculator 522b, and the maximum capacity calculator 522c. In the above-described example, measurement data in a voltage range near a feature point (e.g., 3.4 to 3.6 V) and a voltage range near the upper limit voltage $V_{UL}$ (e.g., 4.15 to 4.2 V) allows calculation of the capacity deterioration amount $\Delta Q$, the temporary maximum capacity $Q_{DUT}$, and the maximum capacity $Q_{DUTMAX}$ Diagnostic time can be reduced by not performing measurement in a range other than these ranges.

Note that, in some battery cells, the battery voltage V greatly increases at the end of charge. The above-described calculation method can be applied even to such a type of battery cell. This will be described with reference to FIGS. 18 and 19.

Figure 18:
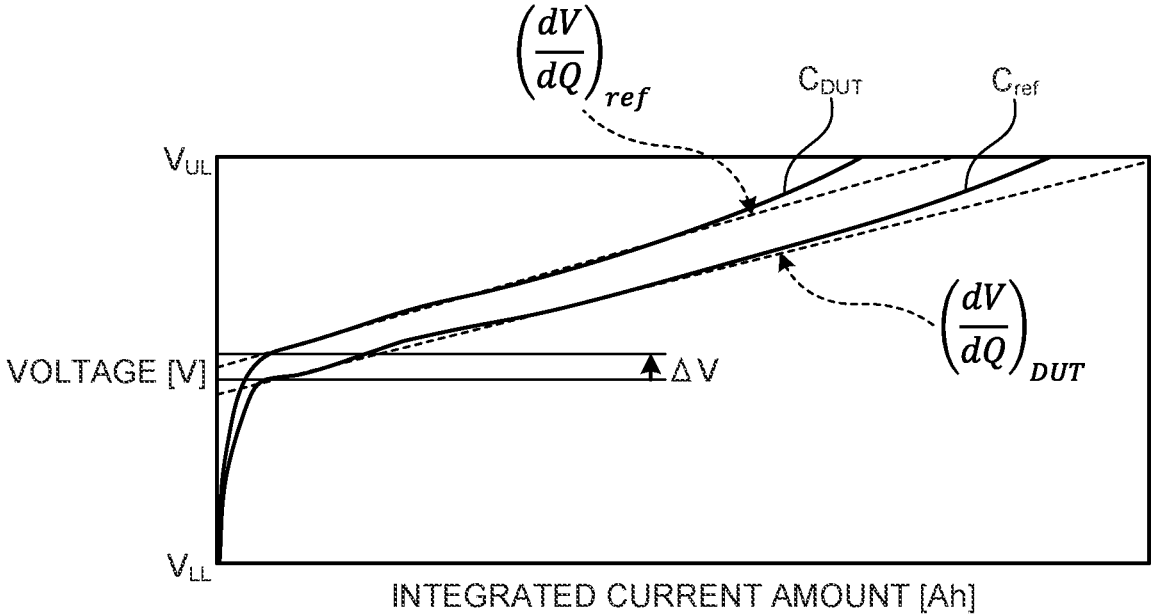
FIG. 18 illustrates an example of the reference Q-V curve and the measurement Q-V curve of another type of battery cell.
Figure 19:
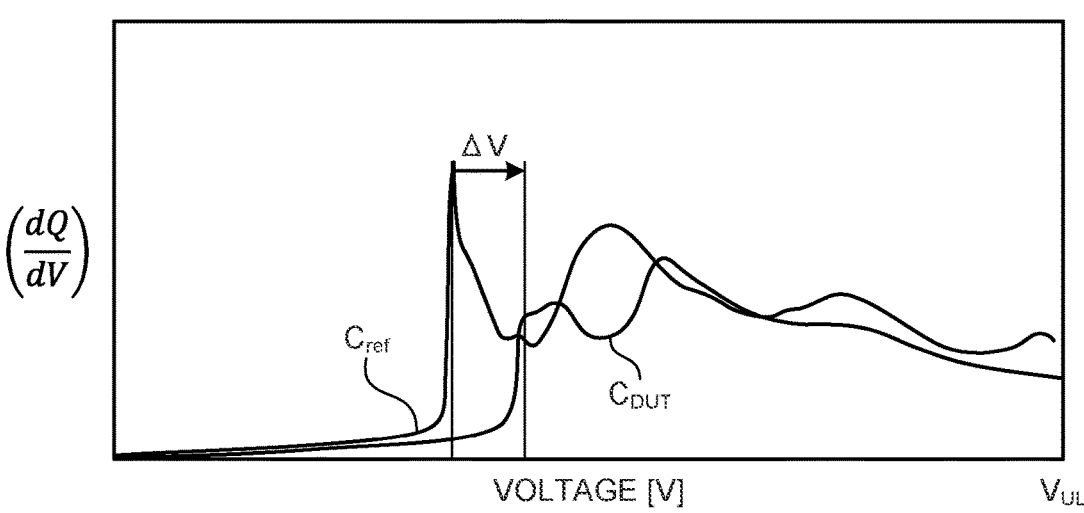
FIG. 19 illustrates an example of the differential curve.

FIG. 18 illustrates an example of a reference Q-V curve and a measurement Q-V curve of another type of battery cell. FIG. 19 illustrates an example of a differential curve. The battery voltage V greatly increases near the upper limit voltage $V_{UL}$, that is, at the end of charge. Also in this case, similarly to the method described so far, the capacity deterioration amount $\Delta Q$ can be calculated by multiplying the inclination of the integrated current amount to the battery voltage V $(dQ/dV)$ by the voltage difference $\Delta V$. The temporary maximum capacity $Q_{DUT}$ can be calculated by multiplying the ratio between the inclination $(dV/dQ)_{DUT}$ of the measurement Q-V curve and the inclination $(dV/dQ)_{ref}$ of the reference Q-V curve by the reference maximum capacity $Q_{ref}$. The maximum capacity $Q_{DUTMAX}$ can also be calculated.

Note that, in the above description, an example in which the differential curve is the curve $(dQ/dV)$ obtained by differentiating the integrated current amount with respect to the battery voltage V has been described. Note, however, that, as described above, the differential curve may be a curve $(dV/dQ)$ obtained by differentiating the battery voltage V with respect to the integrated current amount.

Figure 20:
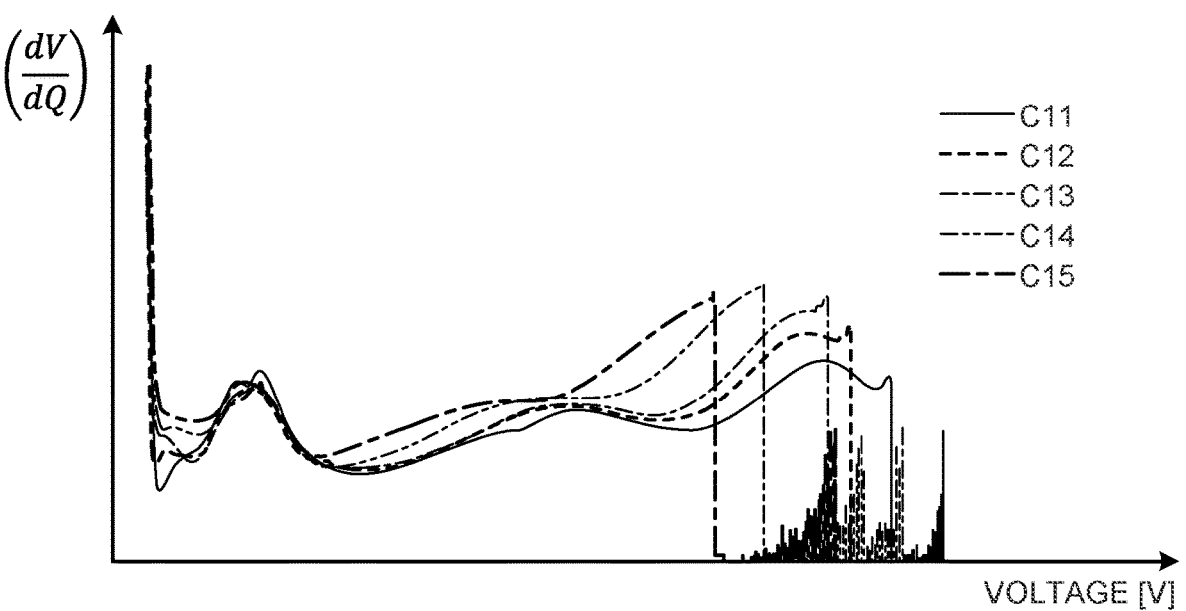
FIG. 20 illustrates another example of the differential curve.

FIG. 20 illustrates another example of the differential curve. The illustrated differential curve is a curve $(dV/dQ)$ obtained by differentiating the battery voltage V with respect to the integrated current amount. Five differential curves having different progress states of capacity deterioration are illustrated as graph lines C11 to C15. The capacity deterioration of battery cells progresses in the order of the graph lines C11 to C15. Such differential curves also have feature points (e.g., local maximum value that appears first). Therefore, the voltage difference $\Delta V$ can be calculated.

Figure 21:
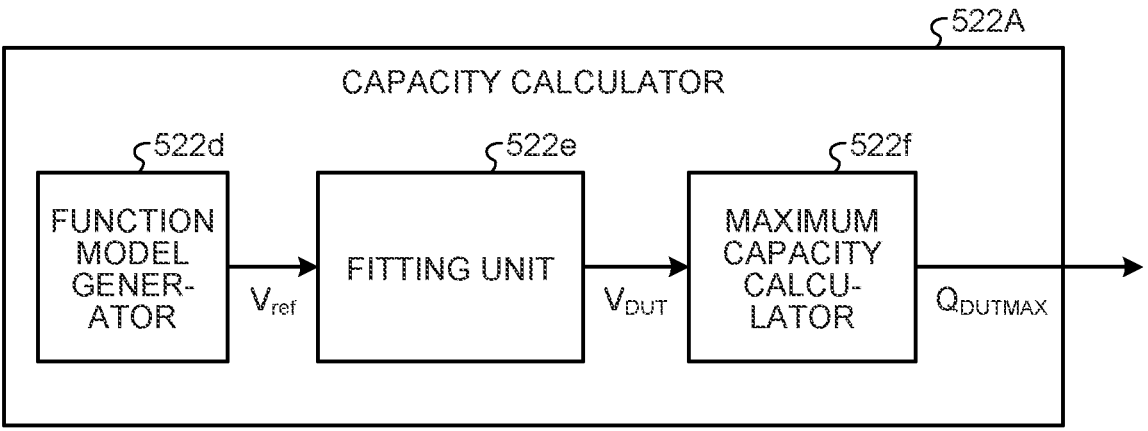
FIG. 21 illustrates another example of the schematic configuration of the capacity calculator according to one or more embodiments.

A calculation method different from the above-described calculation method adopted by the capacity calculator 522 will be described with reference to FIGS. 21 and 22. FIG. 21 illustrates another example of the schematic configuration of the capacity calculator. The illustrated capacity calculator 522A calculates a value related to the capacity of the battery cell DUT by using a function model approximating the Q-V curve of the battery cell DUT. The capacity calculator 522A includes, as functional blocks therefor, a function model generator 522d, a fitting unit 522e, and a maximum capacity calculator 522f.

Figure 22:
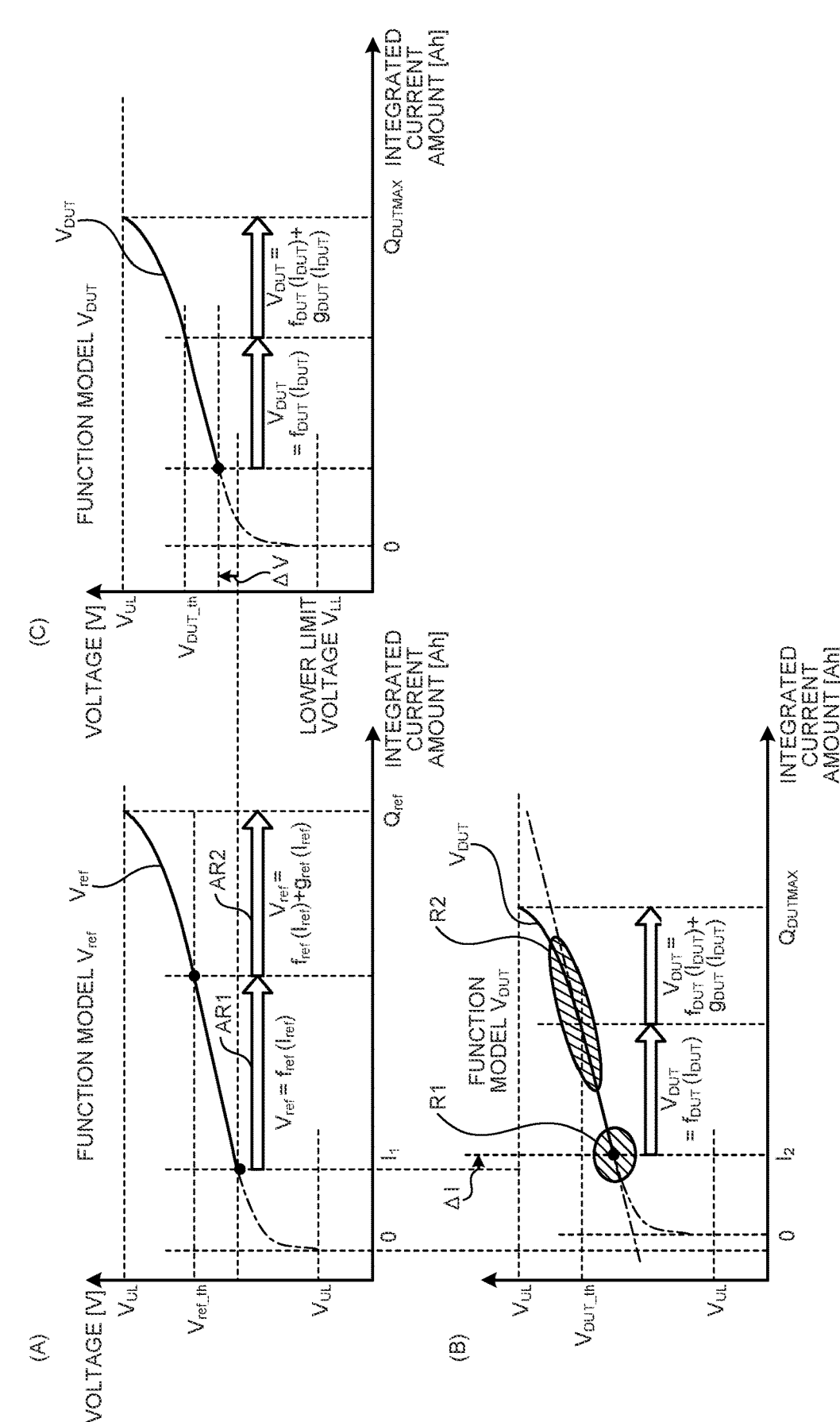
FIG. 22 illustrates another calculation method according to one or more embodiments.

FIG. 22 illustrates the other calculation method. As illustrated in (A) of FIG. 22, the function model generator 522d generates a function model $V_{ref}$ fitted to the reference Q-V curve. The function model $V_{ref}$ may approximate a part of the reference Q-V curve. In this example, the function model $V_{ref}$ approximates a portion corresponding to a linear region indicated by an arrow AR1 and a non-linear region indicated by an arrow AR2 in the reference Q-V curve. Note that a graph line of a region outside an approximation range is indicated by a dash dotted line. In the linear region, the battery voltage V may substantially linearly change to the integrated current amount. The linear region may have a voltage equal to or greater than the voltage at a feature point. In the non-linear region, the battery voltage V non-linearly changes to the integrated current amount. The non-linear region is located on a high voltage side (high SOC state side) than the linear region. The battery voltage V at the boundary between the linear region and the non-linear region is referred to as a threshold voltage $V_{ref\_th}$, and illustrated. The function model $V_{ref}$ can also be said as a function model at a voltage equal to or greater than the voltage at the feature point (threshold voltage $V_{ref\_th}$).

The illustrated function model $V_{ref}$ is determined so as to satisfy $V_{ref}=f_{ref}(I_{ref})$ in the linear region and $V_{ref}=f_{ref}(I_{ref})+g_{ref}(I_{ref})$ in the non-linear region. $I_{ref}$ is an integrated current amount in the graph of (A) of FIG. 22. The function $f_{ref}(I_{ref})$ is, for example, a linear function having the integrated current amount $I_{ref}$ as a variable. The function $g_{ref}(I_{ref})$ is, for example, an exponential function or a multi-order function having the integrated current amount $I_{ref}$ as a variable. Parameters (e.g., coefficients) of the function $f_{ref}(I_{ref})$ and the function $g_{ref}(I_{ref})$ are adjusted so as to approximate a corresponding portion of the reference Q-V curve (graph line $C_{ref}$). A common method such as a least squares method may be adopted for the approximation adjustment.

The fitting unit 522e fits the function model $V_{ref}$ generated by the function model generator 522d to the acquired data 31. A parameter of the function model $V_{ref}$ is adjusted so as to approximate the acquired data 31. (B) and (C) of FIG. 22 illustrate the function model $V_{ref}$ after fitting as a function model $V_{DUT}$. The function model $V_{DUT}$ approximates the Q-V curve of the battery cell DUT. Note that a graph line of a region outside an approximation range is indicated by a dash dotted line. The graph of (B) of FIG. 22 is drawn at a position where the relation between the horizontal axes with the graph of (A) of FIG. 22 is easily grasped. The graph of (C) of FIG. 22 is drawn at a position where the relation between the vertical axes with the graph of (A) of FIG. 22 is easily grasped. The battery voltage V at the boundary between the linear region and the non-linear region in the function model $V_{DUT}$ is referred to as a threshold voltage $V_{DUT\_th}$, and illustrated. The function model $V_{DUT}$ can also be said as a function model at a voltage equal to or greater than the threshold voltage $V_{DUT\_th}$.

In this example, the function model $V_{DUT}$ is represented by using a function $f_{DUT}(I_{DUT})$ and a function $g_{DUT}(I_{DUT})$. $I_{DUT}$ is an integrated current amount in the graphs of (B) and (C) of FIG. 22. The function $f_{DUT}(I_{DUT})$ is obtained by adjusting a parameter of the above-described function $f_{ref}(I_{ref})$ The function $g_{DUT}(I_{DUT})$ is obtained by adjusting a parameter of the above-described function $g_{ref}(I_{ref})$.

A part of data of the Q-V curve of the battery cell DUT is sufficient for the measurement data 42 necessary for fitting performed by the fitting unit 522e. (B) of FIG. 22 illustrates a range R1 and a range R2 as the range of the necessary acquired data 31. The range R1 includes a feature point and the surrounding thereof. The range R2 includes the boundary between the linear region and the non-linear region and the surrounding thereof. Measurement data in these ranges R1 and R2 allows fitting of a function $f_{DUT}(I_C)$ and a function $g_{DUT}(I_C)$ corresponding to the linear region and the non-linear region.

The maximum capacity calculator 522f calculates the maximum capacity $Q_{DUTMAX}$ of the battery cell DUT by using the function model $V_{ref}$ after fitting performed by the fitting unit 522e, that is, the function model $V_{DUT}$. An integrated current amount $I_C$ in which the battery voltage V indicated by the function model $V_{DUT}$ is the upper limit voltage $V_{UL}$ can be the maximum capacity to be obtained.

Note, however, that, as understood from (A) and (C) of FIG. 22, the horizontal axis of the function model $V_{ref}$ does not coincide with the horizontal axis of the function model $V_{DUT}$. The maximum capacity $Q_{DUTMAX}$ can be calculated by correcting the deviation between the horizontal axes (by aligning horizontal axes).

Here, since a remaining capacity (Ah) at a feature point in a region in the low SOC state is the first reaction accompanying battery energy absorption at the time of charge, it is approximated (assumed) that a battery cell before progress of capacity deterioration and the battery cell after the progress have the same amount. In this case, the position of the feature point in the differential curve of the function model $V_{DUT}$ is required to be aligned with the position of the feature point in the differential curve of the function model $V_{ref}$.

The integrated current amount at a feature point of the function model $V_{ref}$ is referred to as an integrated current amount $I_1$ and illustrated. The integrated current amount $I_1$ is calculated as an integrated current amount corresponding to the voltage at a feature point of the differential curve (dQ/dV) calculated from the measurement data in the range R1 of the reference data 41, for example. The integrated current amount at a feature point of the function model $V_{DUT}$ is referred to as an integrated current amount $I_2$ and illustrated. The integrated current amount $I_2$ is calculated as an integrated current amount corresponding to the voltage at a feature point of the differential curve (dQ/dV) calculated from the measurement data in the range R1 of the acquired data 31, for example. When a difference between the horizontal axis of the function model $V_{ref}$ and the horizontal axis of the function model $V_{DUT}$ is defined as $\Delta I$, $\Delta I=I_2-I_1$ is established. The horizontal axis can be corrected by subtracting $\Delta I$ from the integrated current amount $I_{DUT}$ in the function model $V_{DUT}$.

The calculation performed by the maximum capacity calculator 522f includes correction to align the positions of feature points in the differential curves of the function model $V_{ref}$ and the function model $V_{DUT}$. Specifically, the maximum capacity calculator 522f calculates the integrated current amount $I_{DUT}$ in which the function model $V_{DUT}$ in the non-linear region, that is, $f_{DUT}(I_{DUT})+g_{DUT}(I_{DUT})$ is equal to the upper limit voltage $V_{UL}$, and further calculates a value corrected by $\Delta I$ ($I_{DUT}-\Delta I$) as the maximum capacity $Q_{DUTMAX}$. As a result, an appropriate maximum capacity in consideration of the deviation between the horizontal axes is calculated.

The maximum capacity calculator 522f may calculate various values related to the capacity by using not only the maximum capacity $Q_{DUTMAX}$ but the function model $V_{DUT}$ and a differential curve thereof. For example, since the voltage difference $\Delta V$ can be calculated as illustrated in (C) of FIG. 22, the capacity deterioration amount $\Delta Q$ caused by the first factor (potential deviation between positive and negative electrodes) can be calculated. The temporary maximum capacity $Q_{DUT}$ after capacity deterioration caused by the second factor (deactivation) can also be calculated.

Returning to FIG. 5, the diagnostic unit 5 may have a function of calculating the effective capacity of the storage battery system 9 and determining whether or not maintenance such as replacement of the battery cell DUT is necessary. For example, the effective capacity is calculated as a difference between the integrated current amount at the lower limit voltage $V_{LL}$ of the battery cell DUT acquired in data as the MIN cell in the low SOC state and the integrated current amount at the upper limit voltage $V_{UL}$ of the battery cell acquired in data as the MAX cell in the high SOC state.

Whether or not maintenance is necessary may be determined based on the above-described diagnostic result. For example, it may be determined that the maintenance is necessary in, for example, a case of imbalance state, a case where the imbalance amount UB is larger than a predetermined imbalance amount, and a case where the maximum capacity $Q_{DUTMAX}$ is less than a predetermined capacity.

The output unit 6 outputs a diagnostic result of the diagnostic unit 5 as a diagnostic result of the storage battery system 9. Examples of the output include presentation (e.g., display) to a user and data transmission to an external server device (not illustrated). For example, the output unit 6 outputs a determination result of the balance determination unit 51, that is, a state indicating which of the balanced state and the imbalance state the cell balance of the storage battery system 9 is in. The output unit 6 outputs the imbalance amount UB calculated by the imbalance amount calculator 521 of the calculator 52. The output unit 6 outputs a calculation result of the capacity calculator 522, for example, the maximum capacity $Q_{DUTMAX}$ of the battery cell DUT calculated by the maximum capacity calculator 522c or the maximum capacity calculator 522f. Information on the classification of the battery cell DUT may be output together. For example, in the case of the battery cell DUT of the classification 1, the maximum capacity $Q_{DUT}$ is output together with notice that the battery cell DUT of the classification 1 has a minimum and most deteriorated capacity. In the case of the battery cell DUT of the classification 2, the maximum capacity $Q_{DUT}$ is output together with notice that the battery cell DUT of the classification 2 has a maximum and least deteriorated capacity. Information on other classifications is also as described above. A decrease amount ($Q_{ref}-Q_{DUTMAX}$) from the reference maximum capacity $Q_{ref}$ may be output. A remaining capacity calculated from the battery voltage V of the battery cell DUT at the end of diagnosis may be output.

The output unit 6 may output the capacity deterioration amount $\Delta Q$ calculated by the first calculator 522a and the temporary maximum capacity $Q_{DUT}$ calculated by the second calculator 522b. The capacity deterioration amount $\Delta Q$ may be displayed together with notice that the capacity deterioration amount $\Delta Q$ is caused by the first factor (potential deviation between positive and negative electrodes), for example. The temporary maximum capacity $Q_{DUT}$ may be displayed together with notice that the temporary maximum capacity $Q_{DUT}$ is a temporary capacity deterioration amount in consideration of only capacity deterioration caused by the second factor (deactivation). This contributes to grasping of a deterioration factor. The output unit 6 may output the effective capacity of the storage battery system 9 calculated by the diagnostic unit 5, whether or not maintenance such as replacement of the battery cell DUT is necessary, and the like.

For example, as described above, the storage battery system 9 can be diagnosed.

Embodiments of the disclosed technique have been described above. The disclosed technique is not limited to the above-described embodiments. For example, in the above-described embodiments, an example in which the diagnostic unit 5 (FIGS. 5 and 13) includes the three functional blocks of the balance determination unit 51, the imbalance amount calculator 521, and the capacity calculator 522 has been described. Note, however, that the diagnostic unit 5 is not required to include all of these functional blocks. For example, the diagnostic unit 5 is only required to include at least one of the balance determination unit 51, the imbalance amount calculator 521, or the capacity calculator 522. Only the determination of the balanced state and the imbalance state with the balance determination unit 51 leads to the diagnosis of the storage battery system 9. Only the calculation of the imbalance amount UB with the imbalance amount calculator 521 leads to the diagnosis of the storage battery system 9. Only the calculation of a value related to the capacity of the battery cell DUT with the capacity calculator 522 leads to the diagnosis of the storage battery system 9.

In the above-described embodiments, an example in which the capacity calculator 522 (FIGS. 13 and 15) includes three functional blocks of the first calculator 522*a*, the second calculator 522*b*, and the maximum capacity calculator 522*c* has been described. Note, however, that the capacity calculator 522 is not required to include all of these functional blocks. For example, the capacity calculator 522 is only required to include at least one of the first calculator 522*a* or the second calculator 522*b*. Only the calculation of the capacity deterioration amount ΔQ with the first calculator 522*a* leads to the diagnosis of the storage battery system 9. Only the calculation of the temporary maximum capacity $Q_{DUT}$ with the second calculator 522*b* leads to the diagnosis of the storage battery system 9.

In the above description, one or more embodiments have been described mainly from the form of a device such as the diagnostic device 1 and the aspect of a program (instructions) such as a diagnostic program 34. Note, however, that various pieces of processing, that is, a diagnostic method achieved by a device and a program (instructions) is also one or more embodiments.

The above-described technique is specified as follows, for example. One disclosed technique is a diagnostic device. As described with reference to FIGS. 5 to 13 and the like, the diagnostic device 1 includes the acquisition unit 2 and the diagnostic unit 5. The acquisition unit 2 acquires data (data including voltage and integrated current amount) of only some (i.e., two or more but not all) of a plurality of battery cells DUT constituting the storage battery system 9. The diagnostic unit 5 diagnoses the storage battery system 9 based on the data of some battery cells DUT acquired by the acquisition unit 2. Some battery cells DUT include a battery cell DUT acquired in data as a MIN cell (battery cell DUT having minimum voltage) in the low SOC state, a battery cell DUT acquired in data as a MAX cell (battery cell DUT having maximum voltage) in the low SOC state, a battery cell DUT acquired in data as a MIN cell in the high SOC state, and a battery cell DUT acquired in data as a MAX cell in the high SOC state. The diagnostic unit 5 includes at least one of the balance determination unit 51, the imbalance amount calculator 521, or the capacity calculator 522. The balance determination unit 51 determines which of the balanced state and the imbalance state the plurality of battery cells DUT is in. The imbalance amount calculator 521 calculates the imbalance amount UB between the capacities of the battery cells DUT. The capacity calculator 522 calculates a value related to the capacity of the battery cell DUT.

According to the above-described diagnostic device 1, data of some battery cells DUT, more specifically, data of the battery cell DUT acquired in data as a MIN cell in the low SOC state, data of the battery cell DUT acquired in data as a MAX cell in the low SOC state, data of the battery cell DUT acquired in data as a MIN cell in the high SOC state and the battery cell DUT acquired in data as a MAX cell in the high SOC state are acquired. As described above with reference to FIGS. 6 and 7 and the like, some of such battery cells DUT have a high need for management (data acquisition) from the viewpoint of diagnosis of the storage battery system 9. For example, the diagnostic device 1 determines balance, calculates the imbalance amount UB, and calculates a value related to capacity based on data of these battery cells DUT having a high need for management. In such a way, the storage battery system 9 can be diagnosed from data of some battery cells DUT.

As described with reference to FIGS. 6, 7, and 13 and the like, the balance determination unit 51 may determine which of the balanced state and the imbalance state a plurality of battery cells DUT in in based on the similarity and difference between the battery cell DUT acquired in data as the MIN cell in the low SOC state and the battery cell DUT acquired in data as the MAX cell in the high SOC state. For example, in such a way, the cell balance can be determined from the data of some battery cells DUT.

As described with reference to FIGS. 13 and 14 and the like, the imbalance amount calculator 521 may calculate the difference between the integrated current amounts of the battery cells DUT at the same voltage as the imbalance amount UB. For example, in such a way, the imbalance amount UB can be determined from the data of some battery cells DUT.

As described with reference to FIGS. 5, 10, and 11 and the like, the diagnostic unit 5 may diagnose the storage battery system 9 based on data of a battery cell DUT whose data acquisition frequency of the acquisition unit 2 is equal to or greater than a predetermined threshold among some battery cells DUT. More accurate diagnosis using data of only a battery cell DUT having a high need for management is possible.

As described with reference to FIGS. 5, 12, and 15 to 22 and the like, the capacity calculator 522 (or capacity calculator 522A) may calculate a value related to the capacity of the battery cell DUT based on a result of comparison between the measurement Q-V curve and the reference Q-V curve. The measurement Q-V curve indicates the relation between a voltage and an integrated current amount, which are acquired from data of some battery cells DUT. The diagnostic device 1 may include a data complementing unit 4 that complements measurement data of a specific battery cell DUT acquired by the acquisition unit 2 in order to obtain at least one of the measurement Q-V curve or the reference Q-V curve. In that case, the data complementing unit 4 may complement the data of the specific battery cell DUT by using data of another battery cell DUT different from the specific battery cell DUT. For example, in such a way, the value related to capacity can be calculated. Since a part of data of the Q-V curve of the battery cell DUT is sufficient for data (e.g., acquired data 31) necessary for calculation, diagnostic time can be reduced. For example, diagnostic time can be shortened. Based on the diagnostic time, performance of a battery cell or a storage battery system is evaluated after the battery cell or the storage battery system is used in an electric vehicle, a hybrid vehicle, and the like, and determination of whether the battery cell or the storage battery system is to be reused or recycled for retrieving materials is made.

A method of diagnosing a battery cell DUT and the storage battery system 9 with the diagnostic device 1 is also one of the disclosed techniques. The diagnostic method includes: acquiring data (data including voltage and integrated current amount) of only some (i.e., two or more but not all) among a plurality of battery cells DUT constituting the storage battery system 9; and diagnosing the storage battery system 9 based on the acquired data of some battery cells DUT. Some battery cells DUT are as described above.

The diagnosing includes at least one of: determining which of the balanced state and the imbalance state a plurality of battery cells DUT is in; calculating the imbalance amount UB between the capacities of the battery cells DUT; or calculating a value related to a capacity of a battery cell DUT. Effects similar to those of the above-described diagnostic device 1 are obtained.

The diagnostic program 34 described with reference to FIG. 5 and the like is also one of the disclosed techniques. The diagnostic program 34 causes a computer to execute processing of: acquiring data (data including voltage and integrated current amount) of only some (i.e., two or more but not all) among a plurality of battery cells DUT constituting the storage battery system 9; and diagnosing the storage battery system 9 based on the acquired data of some battery cells DUT. Some battery cells DUT are as described above. Diagnosing processing includes at least one of: processing of determining which of the balanced state and the imbalance state a plurality of battery cells DUT is in; processing of calculating the imbalance amount between the capacities of the battery cells DUT; or processing of calculating a value related to a capacity of a battery cell DUT. Effects similar to those of the above-described diagnostic device 1 are obtained.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. A diagnostic device for diagnosing a state of an entirety of a storage battery system used in an electric vehicle or a hybrid vehicle, the diagnostic device comprising:

a receiver configured to receive data only from a specific subset of two or more, but not all, of battery cells constituting the storage battery system, wherein the data consists of a voltage value and an integrated current amount value of each of the two or more battery cells; and a controller configured to:

identify from among the battery cells, based only on the received data from the specific subset, the specific subset of the two or more of the battery cells consisting of:

a low-state MIN battery cell acquired in data as a battery cell having a minimum voltage in a low state of charge (SOC) state;

a low-state MAX battery cell acquired in data as a battery cell having a maximum voltage in the low SOC state;

a high-state MIN battery cell acquired in data as a battery cell having a minimum voltage in a high SOC state; and a high-state MAX battery cell acquired in data as a battery cell having a maximum voltage in the high SOC state, execute at least one of:

generating balance-state indication data indicating whether the battery cells are in a balanced state or an imbalance state based on similarity and difference between the low-state MIN battery cell and the high-state MAX battery cell;

calculating, as an imbalance amount between capacities of the battery cells, a difference between integrated current amounts of the battery cells at a same voltage, and generating imbalance amount data indicating the calculated difference; and calculating a value related to a capacity of a battery cell based on a result of comparison between a measurement Q-V curve obtained from the received data and a reference Q-V curve and generating capacity-related data indicating the calculated value related to the capacity, wherein the reference Q-V curve is stored in a storage and indicates a relation between a voltage and an integrated current amount, and the measurement Q-V curve indicates a relation between a voltage and an integrated current amount which are obtained from the received data, and causes an output unit to output at least one of the generated balance-state indication data, the generated imbalance amount data, and the generated capacity-related data.

2. The diagnostic device according to claim 1, wherein the controller is configured to diagnose the storage battery system based on the received data of a battery cell whose data receiving frequency of the receiver is equal to or greater than a predetermined threshold among the two or more of the battery cells.

3. The diagnostic device according to claim 1, wherein when the controller is configured to execute calculating the value related to the capacity of the battery cell, the controller is configured to complement measurement data of a specific battery cell received by the receiver to obtain at least one of the measurement Q-V curve and the reference Q-V curve.

4. The diagnostic device according to claim 3, wherein the controller is configured to complement the measurement data by using the received data of another battery cell different from the specific battery cell.

5. A diagnostic method for diagnosing a state of an entirety of a storage battery system used in an electric vehicle or a hybrid vehicle, the diagnostic method comprising:

receiving data only from a specific subset of two or more, but not all, of battery cells constituting the storage battery system, wherein the data consists of a voltage value and an integrated current amount value of each of the two or more battery cells; and identifying from among the battery cells, based only on the received data from the specific subset, the specific subset of the two or more of the battery cells consisting of:

a low-state MIN battery cell acquired in data as a battery cell having a minimum voltage in a low state of charge (SOC) state;

a low-state MAX battery cell acquired in data as a battery cell having a maximum voltage in the low SOC state;

a high-state MIN battery cell acquired in data as a battery cell having a minimum voltage in a high SOC state; and a high-state Max battery cell acquired in data as a battery cell having a maximum voltage in the high SOC state;

at least one of:

generating balance-state indication data indicating whether the battery cells are in a balanced state or an imbalance state based on similarity and difference between the low-state MIN battery cell and the high-state MAX battery cell;

calculating, as an imbalance amount between capacities of the battery cells, a difference between integrated current amounts of the battery cells at a same voltage and generating imbalance amount data indicating the calculated difference; and calculating a value related to a capacity of a battery cell based on a result of comparison between a measurement Q-V curve obtained from the received data and a reference Q-V curve and generating capacity-related data indicating the calculated value related to the capacity, wherein the reference Q-V curve is stored in a storage and indicates a relation between a voltage and an integrated current amount, and the measurement Q-V curve indicates a relation between a voltage and an integrated current amount which are obtained from the received data, and causing an output unit to output at least one of the generated balance-state indication data, the generated imbalance amount data, and the generated capacity-related data.

6. A non-transitory computer-readable recording medium having stored therein diagnostic instructions for diagnosing a state of an entirety of a storage battery system used in an electric vehicle or a hybrid vehicle that cause a computer to execute processing of:

receiving data only from a specific subset of two or more, but not all, of battery cells constituting the storage battery system, wherein the data consists of a voltage value and an integrated current amount value of each of the two or more battery cells; and identifying from among the battery cells, based only on the received data from the specific subset, the specific subset of the two or more of the battery cells consisting of:

a low-state MIN battery cell acquired in data as a battery cell having a minimum voltage in a low state of charge (SOC) state;

a low-state MAX battery cell acquired in data as a battery cell having a maximum voltage in the low SOC state;

a high-state MIN battery cell acquired in data as a battery cell having a minimum voltage in a high SOC state; and a high-state MAX battery cell acquired in data as a battery cell having a maximum voltage in the high SOC state; and at least one of:

generating balance-state indication data indicating whether the battery cells are in a balanced state or an imbalance state based on similarity and difference between the low-state MIN battery cell and the high-state MAX battery cell;

calculating as an imbalance amount between capacities of the battery cells, a difference between integrated current amounts of the battery cells at a same voltage, and generating imbalance amount data indicating the calculated difference; and calculating a value related to a capacity of a battery cell based on a result of comparison between a measurement Q-V curve obtained from the received data and a reference Q-V curve and generating capacity-related data indicating the calculated value related to the capacity, wherein the reference Q-V curve is stored in a storage and indicates a relation between a voltage and an integrated current amount, and the measurement Q-V curve indicates a relation between a voltage and an integrated current amount which are obtained from the received data, and causing an output unit to output at least one of the generated balance-state indication data, the generated imbalance amount data, and the generated capacity-related data.

* * * * *